(12) United States Patent
Arimoto et al.

(10) Patent No.: US 10,177,022 B2
(45) Date of Patent: Jan. 8, 2019

(54) ADHESIVE FOR TEMPORARY BONDING, ADHESIVE LAYER, WAFER WORK PIECE AND METHOD FOR MANUFACTURING SEMICONDUCTOR DEVICE USING SAME, REWORK SOLVENT, POLYIMIDE COPOLYMER, POLYIMIDE MIXED RESIN, AND RESIN COMPOSITION

(71) Applicant: TORAY INDUSTRIES, INC., Tokyo (JP)

(72) Inventors: Shinji Arimoto, Otsu (JP); Takenori Fujiwara, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 157 days.

(21) Appl. No.: 15/502,406

(22) PCT Filed: Aug. 5, 2015

(86) PCT No.: PCT/JP2015/072248
§ 371 (c)(1),
(2) Date: Feb. 7, 2017

(87) PCT Pub. No.: WO2016/021646
PCT Pub. Date: Feb. 11, 2016

(65) Prior Publication Data
US 2017/0221746 A1     Aug. 3, 2017

(30) Foreign Application Priority Data

Aug. 8, 2014 (JP) .................................. 2014-162145
Sep. 30, 2014 (JP) .................................. 2014-200265

(51) Int. Cl.

| | | |
|---|---|---|
| C09J 183/14 | (2006.01) | |
| H01L 21/683 | (2006.01) | |
| C08G 73/10 | (2006.01) | |
| C09J 7/00 | (2018.01) | |
| C09J 11/06 | (2006.01) | |
| C08K 5/544 | (2006.01) | |
| C09J 179/08 | (2006.01) | |
| C09J 183/04 | (2006.01) | |
| C11D 7/50 | (2006.01) | |

(Continued)

(52) U.S. Cl.
CPC ............ *H01L 21/6835* (2013.01); *B32B 7/12* (2013.01); *B32B 43/006* (2013.01); *C08G 73/10* (2013.01); *C08K 5/544* (2013.01); *C08L 79/08* (2013.01); *C08L 83/04* (2013.01); *C09J 5/00* (2013.01); *C09J 7/00* (2013.01); *C09J 11/06* (2013.01); *C09J 179/08* (2013.01); *C09J 183/04* (2013.01); *C09J 183/14* (2013.01); *C11D 7/50* (2013.01); *C11D 7/5013* (2013.01); *C11D 7/5022* (2013.01); *H01L 21/02* (2013.01); *H01L 21/0206* (2013.01); *H01L 21/304* (2013.01); *B32B 2457/14* (2013.01); *C09J 2203/10* (2013.01); *C09J 2205/302* (2013.01); *C09J 2400/10* (2013.01); *C09J 2483/00* (2013.01); *H01L 21/76898* (2013.01); *H01L 2221/68327* (2013.01); *H01L 2221/68381* (2013.01); *Y02P 20/582* (2015.11)

(58) Field of Classification Search
CPC ............................... C09J 183/10; C08G 77/26
See application file for complete search history.

(56) References Cited

U.S. PATENT DOCUMENTS

| | | | | |
|---|---|---|---|---|
| 5,739,263 | A * | 4/1998 | Yoshida ............. | C08G 73/1014 528/353 |
| 2006/0177761 | A1 | 8/2006 | Chai | |
| 2010/0163788 | A1 | 7/2010 | Visintin | |
| 2013/0029145 | A1 | 1/2013 | Kato | |
| 2013/0285217 | A1 | 10/2013 | Yamaguchi | |
| 2015/0017370 | A1 | 1/2015 | Watanabe | |
| 2015/0179494 | A1 | 6/2015 | Kawamori | |

FOREIGN PATENT DOCUMENTS

| | | |
|---|---|---|
| EP | 2735580 A1 | 5/2014 |
| JP | 04175393 | 6/1992 |

(Continued)

OTHER PUBLICATIONS

International Search Report and Written Opinion for International Application No. PCT/JP2015/072248, dated Nov. 10, 2015, 12 pages.

Extended European Search Report for European Application No. 15 830 699.3, dated Jun. 14, 2018, 10 pages.

*Primary Examiner* — Kuo Liang Peng
(74) *Attorney, Agent, or Firm* — RatnerPrestia

(57) ABSTRACT

The present invention provides a temporary-bonding adhesive having excellent heat resistance, whereby a semiconductor circuit formation substrate and a support substrate can be bonded by a single type of adhesive layer, the adhesive force thereof does not change over the course of steps for manufacturing a semiconductor device or the like, and the adhesive can subsequently be easily de-bonded at room temperature under mild conditions; and a method for manufacturing a semiconductor device using the temporary-bonding adhesive. The present invention includes a temporary-bonding adhesive wherein a polyimide copolymer having at least an acid dianhydride residue and a diamine residue, the diamine residue including both of (A1) a polysiloxane-based diamine residue represented by a general formula (1) in which n is a natural number from 1 to 15, and (B1) a polysiloxane-based diamine residue represented by a general formula (1) in which n is a natural number from 16 to 100, the polyimide copolymer containing 40-99.99 mol % of the (A1) residue and 0.01-60 mol % of the (B1) residue.

11 Claims, No Drawings

(51) Int. Cl.
*C08L 79/08* (2006.01)
*C08L 83/04* (2006.01)
*H01L 21/304* (2006.01)
*H01L 21/02* (2006.01)
*B32B 7/12* (2006.01)
*B32B 43/00* (2006.01)
*C09J 5/00* (2006.01)
*H01L 21/768* (2006.01)

(56) References Cited

FOREIGN PATENT DOCUMENTS

| | | |
|---|---|---|
| JP | H05331285 A | 12/1993 |
| JP | 08245989 | 9/1996 |
| JP | 10231426 | 9/1998 |
| JP | 2005509693 | 4/2005 |
| JP | 2010515246 | 5/2010 |
| JP | 2010222485 | 10/2010 |
| JP | 2010254808 | 11/2010 |
| JP | 2013048215 | 3/2013 |
| JP | 2013241568 | 12/2013 |
| JP | 2014029999 | 2/2014 |
| WO | 2013039029 | 3/2015 |
| WO | 2015053132 | 4/2015 |

* cited by examiner

ADHESIVE FOR TEMPORARY BONDING, ADHESIVE LAYER, WAFER WORK PIECE AND METHOD FOR MANUFACTURING SEMICONDUCTOR DEVICE USING SAME, REWORK SOLVENT, POLYIMIDE COPOLYMER, POLYIMIDE MIXED RESIN, AND RESIN COMPOSITION

CROSS REFERENCE TO RELATED APPLICATIONS

This is the U.S. National Phase application of PCT International Application No. PCT/JP2015/072248, filed Aug. 5, 2015, and claims priority to Japanese Patent Application No. 2014-162145, filed Aug. 8, 2014, and Japanese Patent Application No. 2014-200265, filed Sep. 30, 2014, the disclosures of each of these applications being incorporated herein by reference in their entireties for all purposes.

FIELD OF THE INVENTION

The present invention relates to a temporary-bonding adhesive, an adhesive layer, a wafer work piece and a method for manufacturing a semiconductor device using the same, a rework solvent, a polyimide copolymer, a polyimide mixed resin, and a resin composition.

BACKGROUND OF THE INVENTION

In recent years, reductions of weight and thickness of semiconductor devices are proceeding. Technical development in which a semiconductor chip is laminated while being connected through TSV (through-silicon via) in order to achieve higher levels of integration and greater packaging density of the semiconductor device, are being pursued. Further, in the field of power semiconductors, a reduction of conduction loss is required for saving of energy. In order to solve such problems, it is necessary to reduce a thickness of package, and it is investigated to reduce a thickness of a semiconductor circuit formation substrate to at least 1 µm and at most 100 µm and to process the semiconductor circuit formation substrate. In this step, a surface where a circuit is not formed (backside) of the semiconductor circuit formation substrate is polished to reduce a thickness, and a back electrode is formed on the backside. In order to prevent fractures of the semiconductor circuit formation substrate during the steps of polishing and the like, the semiconductor circuit formation substrate is fixed to a support substrate having supporting properties, such as a silicon wafer or a glass substrate, to form a wafer work piece, the wafer work piece is subjected to polishing and back-circuit formation processing, and then the processed semiconductor circuit formation substrate is de-bonded off from the support substrate. In order to bond the semiconductor circuit formation substrate to the support substrate, a temporary-bonding adhesive is used as an adhesive layer. This manufacturing method sometimes includes a step of reworking an adhesive layer or a residue of an adhesive layer respectively remaining on the semiconductor circuit formation substrate or the support substrate with an organic solvent, an alkaline aqueous solution or the like after the step of de-bonding off the semiconductor circuit formation substrate from the support substrate. The organic solvent, the alkaline aqueous solution or the like is referred to as a rework solvent.

Herein, heat resistance enough to endure a semiconductor step is required of the temporary-bonding adhesive, and it is required of the temporary-bonding adhesive that the semiconductor circuit formation substrate can be easily de-bonded off after completion of the processing step. As such a temporary-bonding adhesive, for example, an adhesive in which a polyamide-based or polyimide-based adhesive layer respectively having heat resistance is used, and an adhesive force is varied by heating, and thereby the semiconductor circuit formation substrate is de-bonded off (e.g., refer to Patent Document 1), is proposed. Further, a wafer work piece having a constitution including two types of adhesive layers of a thermoplastic organo polysiloxane-based adhesive layer having heat resistance and a curable modified siloxane-based adhesive layer, wherein these adhesive layers have an adhesive force against which each of the semiconductor circuit formation substrate and the support substrate can be de-bonded off and is de-bonded off by mechanically applying a force at room temperature, is proposed (e.g., Patent Document 2). Further, one which is composed of a single type of cycloolefin-based adhesive layer, and is de-bonded off by mechanically applying a force at room temperature, is proposed (e.g., Patent Document 3).

PATENT DOCUMENTS

Patent Document 1: Japanese Patent Laid-open Publication No. 2010-254808 (CLAIMS)
Patent Document 2: Japanese Patent Laid-open Publication No. 2013-48215 (CLAIMS)
Patent Document 3: Japanese Patent Laid-open Publication No. 2013-241568 (CLAIMS)

SUMMARY OF THE INVENTION

However, the temporary-bonding adhesive in which de-bonding can be performed only by heating like Patent Document 1 has problems that a solder bump is melted during a heating step for de-bonding, and an adhesive force during a processing step is deteriorated to cause the semiconductor to de-bond off in the middle of the step, or an adhesive force during a processing step is increased to cause the semiconductor not to de-bond off.

The temporary-bonding adhesive like Patent Document 2 in which de-bonding off is performed by mechanically applying a force at room temperature does not have the above-mentioned problems. However, two types of adhesive layers need to be formed, and there is a problem of putting a sizable load on the process. The temporary-bonding adhesive like Patent Document 3 is one in which de-bonding off is performed by mechanically applying a force at room temperature by a single type of adhesive layer. However, a cycloolefin-based material has a problem the material is decomposed in the semiconductor step under high-temperatures.

In view of such situations, it is an object of the present invention to provide a temporary-bonding adhesive which can bond a semiconductor circuit formation substrate and a support substrate to each other by a single type of adhesive, has excellent heat resistance and thereby does not undergo a change in the adhesive force over the course of steps for manufacturing a semiconductor device or the like, and can subsequently be easily de-bonded by applying a mechanical force or dissolving in a rework solvent at room temperature under mild conditions; an adhesive layer; a wafer work piece and a method for manufacturing a semiconductor device using the wafer work piece; a rework solvent; a polyimide copolymer; a polyimide mixed resin; and a resin composition.

That is, the present invention includes a temporary-bonding adhesive, wherein the temporary-bonding adhesive is a polyimide copolymer having at least an acid dianhydride residue and a diamine residue, the diamine residue includes both of (A1) a polysiloxane-based diamine residue represented by a general formula (1) in which n is a natural number of 1 to 15, and (B1) a polysiloxane-based diamine residue represented by a general formula (1) in which n is a natural number of 16 to 100, and the polyimide copolymer contains 40 to 99.99 mol % of the (A1) residue and 0.01 to 60 mol % of the (B1) residue:

[Chemical Formula 1]

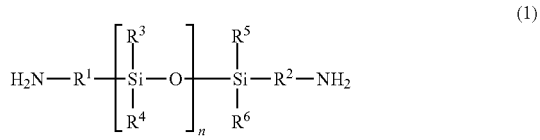

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

Further, the present invention includes a temporary-bonding adhesive, wherein the temporary-bonding adhesive is a polyimide mixed resin including (A2) a polyimide and/or a precursor thereof containing a polysiloxane-based diamine residue represented by a general formula (1) in which n is a natural, number of 1 to 15 and not containing a polysiloxane-based diamine residue represented by a general formula (1) in which n is a natural number of 16 to 100, and (B2) a polyimide and/or a precursor thereof containing a polysiloxane-based diamine residue represented by a general formula (1) in which n is a natural number of 16 to 100 and not containing a polysiloxane-based diamine residue represented by a general formula (1) in which n is a natural number of 1 to 15, and the polyimide mixed resin contains 40 to 99.99 wt % of the (A2) and 0.01 to 60 wt % of the (B2).

[Chemical Formula 2]

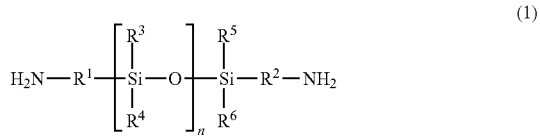

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

Further, the present invention includes a temporary-bonding adhesive, wherein the temporary-bonding adhesive is a resin composition containing (a) a resin (excluding a siloxane polymer represented by a general formula (2)), and at least one of (b-1) a siloxane polymer represented by a general formula (2) and (b-2) a compound represented by a general formula (3):

[Chemical Formula 3]

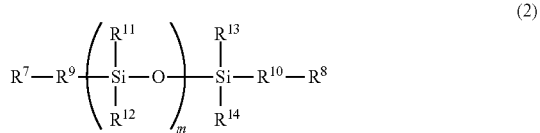

(2)

in which m is an integer of 10 to 100, $R^7$ and $R^8$ may be the same or different and represent a monovalent organic group having 1 to 30 carbon atoms and 0 to 3 nitrogen atoms, $R^9$ and $R^{10}$ may be the same or different and represent an alkylene group having 1 to 30 carbon atoms or a phenylene group, and $R^{11}$ to $R^{14}$ may be the same or different and represent an alkyl group having 1 to 30 carbon atoms, an alkylene group having 1 to 30 carbon atoms, an alkoxy group having 1 to 30 carbon atoms, a phenyl group, or a phenoxy group.

[Chemical Formula 4]

(3)

in which $R^{15}$ represents a monovalent organic group having 2 to 20 carbon atoms and 1 to 3 nitrogen atoms, $R^{16}$ represents hydrogen, an alkyl group having 1 to 20 carbon atoms, or an aromatic group, and a represents an integer of 0 to 4.

Further, the present invention includes an adhesive layer obtained by forming a coating of the temporary-bonding adhesive according to an aspect of the present invention.

Further, the present invention includes a wafer work piece formed by bonding a semiconductor circuit lamination substrate to a support substrate with at least the adhesive layer according to an aspect of the present invention interposed therebetween.

Further, the present invention includes a method for manufacturing a semiconductor device using the wafer work piece according to an aspect of the present invention including at least any one of a step of fabricating the semiconductor circuit formation substrate into a thinner one, a step of subjecting the semiconductor circuit formation substrate of the wafer work piece to device processing, a step of de-bonding off the semiconductor circuit formation substrate of the wafer work piece from a support substrate, and a step of washing, with a solvent, an adhesive layer adhering to the semiconductor circuit formation substrate de-bonded off from the wafer work piece or the support substrate of the wafer work piece.

Further, the present invention includes a rework solvent for cleaning the adhesive layer adhering to the de-bonded semiconductor circuit formation substrate or support substrate, wherein the rework solvent contains at least (A) an amine-based solvent and (B) a solvent represented by the general formula (6):

[Chemical Formula 5]

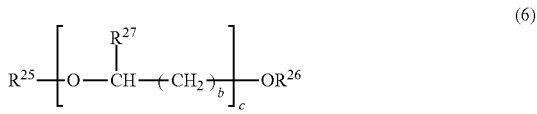

(6)

in which $R^{25}$ and $R^{26}$ independently represent hydrogen, alkyl groups having 1 to 12 carbon atoms, an acetyl group, or aromatic groups, $R^{27}$ represents hydrogen or a methyl group, b is either 0, 1 or 2, and c is an integer of 1 to 3.

Further, the present invention includes a polyimide copolymer having at least an acid dianhydride residue and a diamine residue, wherein the diamine residue includes both of (A1) a polysiloxane-based diamine residue represented by a general formula (1) in which n is a natural number of 1 to 15, and (B1) a polysiloxane-based diamine residue represented by a general formula (1) in which n is a natural number of 16 to 100, and the polyimide copolymer contains 40 to 99.99 mol % of the (A1) residue and 0.01 to 60 mol % of the (B1) residue:

[Chemical Formula 6]

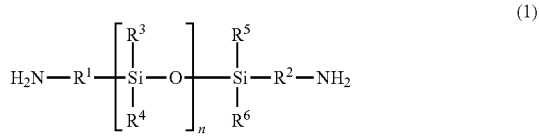

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

Further, the present invention includes a polyimide mixed resin including (A2) a polyimide and/or a precursor thereof having at least an acid dianhydride residue and a diamine residue, containing a polysiloxane-based diamine residue represented by a general formula (1) in which n is a natural number of 1 to 15 and not containing a polysiloxane-based diamine residue represented by a general formula (1) in which n is a natural number of 16 to 100, and (B2) a polyimide and/or a precursor thereof having at least an acid dianhydride residue and a diamine residue, containing a polysiloxane-based diamine residue represented by a general formula (1) in which n is a natural number of 16 to 100 and not containing a polysiloxane-based diamine residue represented by a general formula (1) in which n is a natural number of 1 to 15, and the polyimide mixed resin contains 40 to 99.99 wt % of the (A2) and 0.01 to 60 wt % of the (B2):

[Chemical Formula 7]

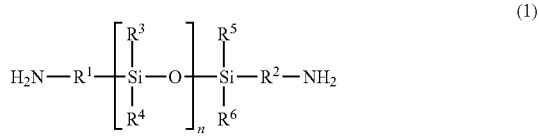

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

Further, the present invention includes a resin composition containing (a) a resin (excluding a siloxane polymer represented by a general formula (2)), and at least one of (b-1) a siloxane polymer represented by a general formula (2) and (b-2) a compound represented by a general formula (3), wherein the (a) resin is a polyimide resin having at least an acid dianhydride residue and a diamine residue and including, in the diamine residue, a polysiloxane-based diamine residue represented by a general formula (5) which is 40 mol % or more in all diamine residues.

[Chemical Formula 8]

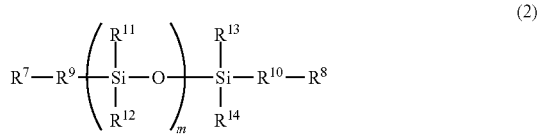

(2)

in which m is an integer of 10 to 100, $R^7$ and $R^8$ may be the same or different and represent a monovalent organic group having 1 to 30 carbon atoms and 0 to 3 nitrogen atoms, $R^9$ and $R^{10}$ may be the same or different and represent an alkylene group having 1 to 30 carbon atoms or a phenylene group, and $R^{11}$ to $R^{14}$ may be the same or different and represent an alkyl group having 1 to 30 carbon atoms, an alkylene group having 1 to 30 carbon atoms, an alkoxy group having 1 to 30 carbon atoms, a phenyl group, or a phenoxy group.

[Chemical Formula 9]

(3)

in which $R^{15}$ represents a monovalent organic group having 2 to 20 carbon atoms and 1 to 3 nitrogen atoms, $R^{16}$ represents hydrogen, an alkyl group having 1 to 20 carbon atoms, or an aromatic group, and a represents an integer of 0 to 4.

[Chemical Formula 10]

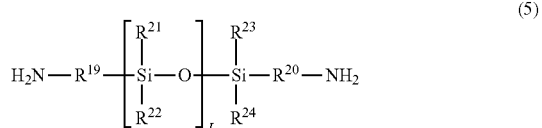

(5)

in which L is an integer of 1 to 100, $R^{19}$ and $R^{20}$ may be the same or different and represent an alkylene group having 1 to 30 carbon atoms or a phenylene group, and $R^{21}$ to $R^{24}$ may be the same or different and represent an alkyl group having 1 to 30 carbon atoms, a phenyl group, or a phenoxy group.

According to the present invention, it is possible to provide a temporary-bonding adhesive having excellent heat resistance which can bond a semiconductor circuit formation substrate and a support substrate to each other by a single type of adhesive, has excellent heat resistance and thereby does not undergo a change in the adhesive force over the course of steps for manufacturing a semiconductor device or the like, and can subsequently be easily de-bonded by applying a mechanical force or dissolving in a rework solvent at room temperature under mild conditions; an adhesive layer; a wafer work piece and a method for manufacturing a semiconductor device using the wafer work piece; a rework solvent; a polyimide copolymer; a polyimide mixed resin; and a resin composition.

DETAILED DESCRIPTION OF EMBODIMENTS OF THE INVENTION

A temporary-bonding adhesive according to an aspect of the present invention is a polyimide copolymer which has at least an acid dianhydride residue and a diamine residue, wherein the diamine residue includes both of (A1) a polysiloxane-based diamine residue represented by a general formula (1) in which n is a natural number of 1 to 15 and (B1) a polysiloxane-based diamine residue represented by a general formula (1) in which n is a natural number of 16 to 100:

[Chemical Formula 11]

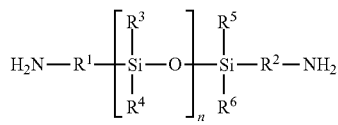

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

The polyimide copolymer of the present invention can be prepared by using at least (A1) a polysiloxane-based diamine represented by the general formula (1) in which n is a natural number of 1 to 15 and (B1) a polysiloxane-based diamine represented by the general formula (1) in which n is a natural number of 16 to 100 as diamine components in the polymerization of a polyimide, and copolymerizing the (A1) with the (B1). By containing two types or more of polysiloxane-based diamines in which natural numbers n are different, the adhesiveness of the surface of the adhesive layer can be lowered in the step of forming the adhesive layer on the substrate serving as an adherend, and therefore it is possible that the semiconductor circuit formation substrate and the support substrate are bonded to each other and then the semiconductor circuit formation substrate and the support substrate are de-bonded off from each other by mechanically applying a force at room temperature under a mild condition. Further, the semiconductor circuit formation substrate and the support substrate can also be de-bonded off from each other by dissolving the adhesive layer under a mild condition of room temperature using a rework solvent described later or the like.

The polyimide copolymer according to an aspect of the present invention contains, in all diamine residues, 40 to 99.99 mol % of the (A1) polysiloxane-based diamine residue represented by the general formula (1) in which n is a natural number of 1 to 15. By containing 40 to 99.99 wt % of the (A1) polysiloxane-based diamine residue represented by the general formula (1) in which n is a natural number of 1 to 15, the polyimide copolymer can exhibit high adhesiveness and can bond a semiconductor circuit formation substrate to a support substrate.

Further, the polyimide copolymer according to an aspect of the present invention contains 0.01 to 60 mol % of the (B1) polysiloxane-based diamine residue represented by the general formula (1) in which n is a natural number of 16 to 100. The content of the (B1) is more preferably 0.01 to 30 mol %. By containing 0.01 to 60 mol % of the (B1) polysiloxane-based diamine residue represented by the general formula (1) in which n is a natural number of 16 to 100, it is possible to prevent voids from being generated in the adhesive layer during a step of processing a device after bonding a semiconductor circuit formation substrate to a support substrate. Moreover, when the content of the (B1) residue is 0.01 to 30 wt %, it is more preferred since the voids are not generated in the adhesive layer during the step of processing a device and high heat resistance can be exhibited.

The polyimide copolymer of the present invention may be a polyimide precursor which is cyclized by heating to become a polyimide, or may be a polyimide which has been cyclized by heating, or may be a polyimide precursor a part of which has been cyclized by heating.

The temporary-bonding adhesive of the present invention includes a polyimide mixed resin including (A2) a polyimide and/or a precursor thereof containing a polysiloxane-based diamine residue represented by a general formula (1) in which n is a natural number of 1 to 15 and not containing a polysiloxane-based diamine residue represented by a general formula (1) in which n is a natural number of 16 to 100, and (B2) a polyimide and/or a precursor thereof containing a polysiloxane-based diamine residue represented by a general formula (1) in which n is a natural number of 16 to 100 and not containing a polysiloxane-based diamine residue represented by a general formula (1) in which n is a natural number of 1 to 15:

[Chemical Formula 12]

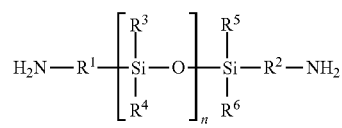

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

The polyimide mixed resin of the present invention can be prepared by mixing a polymerization solution or a powder of (A2) a polyimide and/or a precursor thereof containing a polysiloxane-based diamine residue represented by a general formula (1) in which n is a natural number of 1 to 15 and not containing a polysiloxane-based diamine residue represented by a general formula (1) in which n is a natural number of 16 to 100 with a polymerization solution or a powder of (B2) a polyimide and/or a precursor thereof containing a polysiloxane-based diamine residue represented by a general formula (1) in which n is a natural number of 16 to 100 and not containing a polysiloxane-based diamine residue represented by a general formula (1) in which n is a natural number of 1 to 15.

By mixing the (A2) polyimide and/or the precursor thereof and the (B2) polyimide and/or the precursor thereof which respectively contain polysiloxane-based diamine residues having different polymerization degrees n, the adhesiveness of the surface of the adhesive layer can be lowered in the step of forming the adhesive layer on the substrate serving as an adherend, and therefore it is possible that the semiconductor circuit formation substrate and the support substrate are bonded to each other and then the semiconductor circuit formation substrate and the support substrate are de-bonded off from each other by mechanically applying a force at room temperature under a mild condition. Further, the semiconductor circuit formation substrate and the support substrate can also be de-bonded off from each other by dissolving the adhesive layer under a mild condition of room temperature using a rework solvent described later or the like.

The polyimide mixed resin according to an aspect of the present invention contains 40 to 99.99 wt % of the (A2) polyimide and/or the precursor thereof containing a polysiloxane-based diamine residue represented by a general formula (1) in which n is a natural number of 1 to 15 and not containing a polysiloxane-based diamine residue represented by a general formula (1) in which n is a natural number of 16 to 100. By containing 40 to 99.99 wt % of the (A2), the polyimide mixed resin can exhibit high adhesiveness and can bond a semiconductor circuit formation substrate to a support substrate.

Further, the polyimide mixed resin according to an aspect of the present invention contains 0.01 to 60 wt % of the (B2) polyimide and/or the precursor thereof containing a polysiloxane-based diamine residue represented by a general formula (1) in which n is a natural number of 16 to 100 and not containing a polysiloxane-based diamine residue represented by a general formula (1) in which n is a natural number of 1 to 15. The content of the (B2) is more preferably 0.01 to 30 wt %. By containing 0.01 to 60 wt % of the (B2), it is possible to prevent voids from being generated in the adhesive layer during a step of processing a device after bonding a semiconductor circuit formation substrate to a support substrate. Moreover, when the content of the (B2) is 0.01 to 30 wt %, it is more preferred since the voids are not generated in the adhesive layer and high heat resistance can be exhibited.

An average molecular weight of the polysiloxane-based diamine can be determined by calculating an amino group equivalent by performing neutralization titration of an amino group of polysiloxane-based diamine and doubling the amino group equivalent. For example, a predetermined amount of polysiloxane-based diamine serving as a specimen is taken and put into a beaker, and the polysiloxane-based diamine is dissolved in a predetermined amount of a mixed solution of isopropyl alcohol (hereinafter, referred to as IPA) and toluene in proportions of 1:1. To the resulting solution, a 0.1 N aqueous hydrochloric acid solution is added dropwise while stirring the solution, an amount of the 0.1 N aqueous hydrochloric acid solution added dropwise until reaching a neutralization point is determined, and thereby, the amino group equivalent can be calculated. A value obtained by doubling the amino group equivalent is the average molecular weight.

On the other hand, a molecular weight of the polysiloxane-based diamine used is calculated from its chemical structural formula for the cases of n=1 and n=10, and thereby, a relationship between the value of n and the molecular weight can be obtained as a relational expression of a linear function. By applying the above average molecular weight to the relational expression, an average value of the above n can be determined.

Further, since there may be cases where the polysiloxane-based diamine represented by the general formula (1) is a mixture where n is not a single value but a plurality of n exists, n represents an average value in the invention.

Specific examples of the polysiloxane-based diamine represented by the general formula (1) include α,ω-bis(3-aminopropyl)polydimethylsiloxane, α,ω-bis(3-aminopropyl)polydiethylsiloxane, α,ω-bis(3-aminopropyl)polydipropylsiloxane, α,ω-bis(3-aminopropyl)polydibutylsiloxane, α,ω-bis(3-aminopropyl)polydiphenoxysiloxane, α,ω-bis(2-aminoethyl)polydimethylsiloxane, α,ω-bis(2-aminoethyl)polydiphenoxysiloxane, α,ω-bis(4-aminobutyl)polydimethylsiloxane, α,ω-bis(4-aminobutyl)polydiphenoxysiloxane, α,ω-bis(5-aminopentyl)polydimethylsiloxane, α,ω-bis(5-aminopentyl)polydiphenoxysiloxane, α,ω-bis(4-aminophenyl)polydimethylsiloxane, α,ω-bis(4-aminophenyl)polydiphenoxysiloxane, and the like. The polysiloxane-based diamines described above may be used singly, or two or more species thereof may be used.

Polyimide constituting the polyimide copolymer and the polyimide mixed resin of the present invention may have a residue of aromatic diamine or a residue of alicyclic diamine. The content of the residue of the aromatic diamine or the residue of the alicyclic diamine is preferably 0.1 mol % or more and 40 mol % or less in all diamine residues.

Specific examples of the residue of the aromatic diamine or the alicyclic diamine include 2,5-diaminophenol, 3,5-diaminophenol, 3,3'-dihydroxybenzidine, 4,4'-dihydroxy-3,3'-diaminophenyl propane, 4,4'-dihydroxy-3,3'-diaminophenyl hexafluoropropane, 4,4'-dihydroxy-3,3'-diaminophenyl sulfone, 4,4'-dihydroxy-3,3'-diaminophenyl ether, 3,3'-dihydroxy-4,4'-diaminophenyl ether, 4,4'-dihydroxy-3,3'-diaminophenyl propane methane, 4,4'-dihydroxy-3,3'-diaminobenzophenone, 1,3-bis(4-amino-3-hydroxy phenylbenzene, 1,3-bis(3-amino-4-hydroxy phenyl)benzene, bis(4-(4-amino-3-hydroxy phenoxy)benzene)propane, bis(4-(3-amino-4-hydroxy phenoxy)benzene)sulfone, bis(4-(3-amino-4-hydroxy phenoxy)biphenyl, p-phenylene diamine, m-phenylene diamine, 2,5-diaminotoluene, 2,4-diaminotoluene, 3,5-diaminobenzoic acid, 2,6-diaminobenzoic acid, 2-methoxy-1,4-phenylene diamine, 4,4'-diaminobenzanilide, 3,4'-diaminobenzanilide, 3,3'-diaminobenzanilide, 3,3'-dimethyl-4,4'-diaminobenzanilide, 9,9-bis(4-aminophenyl)fluorene, 9,9-bis(3-aminophenyl)fluorene, 9,9-bis(3-methyl-4-aminophenyl)fluorene, 9,9-bis(3,5-dimethyl-4-aminophenyl)fluorene, 9,9-bis(3-methoxy-4-aminophenyl)fluorene, 9,9-bis(4-aminophenyl)fluorene-4-carboxylic acid, 9,9-bis(4-aminophenyl)fluorene-4-methyl, 9,9-bis(4-aminophenyl)fluorene-4-methoxy, 9,9-bis(4-aminophenyl)fluorene-4-ethyl, 9,9-bis(4-aminophenyl)fluorene-4-sulfone, 9,9-bis(4-aminophenyl)fluorene-3-carboxylic acid, 9,9-bis(4-aminophenyl)fluorene-3-methyl, 1,3-diaminocyclohexane, 2,2'-dimethyl benzidine, 3,3'-dimethyl benzidine, 3,3'-dimethoxy benzidine, 2,4-diaminopyridine, 2,6-diaminopyridine, 1,5-diaminonaphthalene, 2,7-diaminofluorene, p-amino benzylamine, m-amino benzylamine, 4,4'-bis(4-aminophenoxy)biphenyl, 4,4'-diaminodiphenyl ether, 3,3'-diaminodiphenyl ether, 3,4'-diaminodiphenyl ether, 4,4'-diaminodiphenyl sulfone, 3,3'-diaminodiphenyl sulfone, 3,3'-diaminodiphenyl methane, 4,4'-diaminodiphenyl methane, 4,4'-diaminodiphenyl sulfide, 3,3'-diamino benzophenone, 3,4'-diamino benzophenone, 4,4'-diamino benzophenone, 3,3'-dimethyl-4,4'-diaminodiphenyl methane, 1,3-bis(4-aminophenoxy)benzene, 1,3-bis(3-aminophenoxy)benzene, 1,4-bis(4-aminophenoxy)benzene, 1,4-bis(3-aminophenoxy)benzene, 2,2-bis[4-(4-aminophenoxyl)phenyl]propane, 2,2-bis[4-(3-aminophenoxyl)phenyl]propane, bis[4-(4-aminophenoxyl)phenyl]methane, bis[4-(3-aminophenoxyl)phenyl]methane, bis[4-(4-aminophenoxyl)phenyl]ether, bis[4-(3-aminophenoxyl)phenyl]ether, bis[4-(4-aminophenoxyl)phenyl]sulfone, bis[4-(3-aminophenoxyl)phenyl]sulfone, 2,2-bis[4-(4-aminophenoxyl)phenyl]hexafluoropropane, 1,4-diamino cyclohexane, 4,4'-methylene bis (cyclohexyl amine), 3,3'-methylene bis(cyclohexyl amine), 4,4'-diamino-3,3'-dimethyl dicyclohexyl methane, 4,4'-diamino-3,3'-dimethyl dicyclohexyl, benzidine, and the like. The aromatic diamines or the alicyclic diamines described above may be used singly, or two or more species thereof may be used.

Among these aromatic diamines and alicyclic diamines, aromatic diamines with a structure having high bendability are preferred, and specifically, 1,3-bis(3-aminophenoxy)benzene, 3,3'-diaminodiphenyl sulfone, 4,4'-diaminodiphenylether, 3,3'-diaminodiphenylether, and 3,3'-diaminobenzophenone are particularly preferred.

Among the aromatic diamines and alicyclic diamines, the aromatic diamines represented by a general formula (4) are preferably contained. When containing the aromatic diamines represented by a general formula (4), compatibility between the inorganic particles and the polyimide copolymer or the polyimide mixed resin described later can be improved, to suppress the sedimentation of inorganic particles:

[Chemical Formula 13]

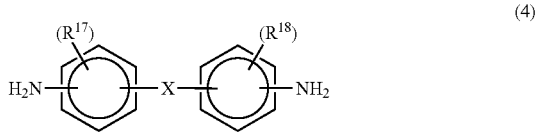

(4)

in which $R^{17}$ and $R^{18}$ may be the same or different and represent groups selected from among an alkyl group having 1 to 30 carbon atoms, an alkoxy group having 1 to 30 carbon atoms, a fluoroalkyl group having 1 to 30 carbon atoms, a hydroxyl group, halogen, a carboxyl group, a carboxylate ester group, a phenyl group, a sulfone group, a nitro group and a cyano group, and X represents a direct bond or the following bond structure.

[Chemical Formula 14]

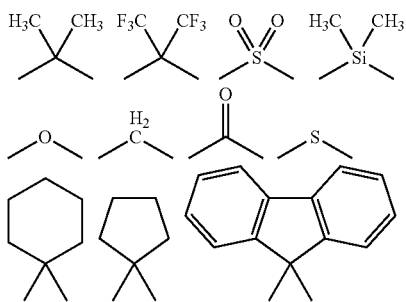

The halogen referred to herein refers to fluorine, chlorine, bromine, or iodine.

The content of the aromatic diamine represented by the general formula (4) is preferably 0.1 mol % or more and 40 mol % or less, and more preferably 0.1 mol % or more and 30 mol % or less in all diamine residues.

Polyimide constituting the polyimide copolymer and the polyimide mixed resin of the present invention preferably includes the residue of an aromatic tetracarboxylic dianhydride as the residue of the acid dianhydride. Specific examples of the aromatic tetracarboxylic dianhydride include pyromellitic dianhydride, 3,3',4,4'-biphenyltetracarboxylic dianhydride, 2,2'-dimethyl-3,3',4,4'-biphenyltetracarboxylic dianhydride, 5,5'-dimethyl-3,3',4,4'-biphenyltetracarboxylic dianhydride, 2,3,3',4'-biphenyltetracarboxylic dianhydride, 2,2',3,3"-biphenyltetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4,4'-diphenylsulfone tetracarboxylic dianhydride, 2,3,3',4'-diphenylsulfone tetracarboxylic dianhydride, 3,3',4,4'-diphenylsulfoxide tetracarboxylic dianhydride, 3,3',4,4'-diphenylsulfide tetracarboxylic dianhydride, 3,3',4,4'-diphenylmethylene tetracarboxylic dianhydride, 4,4'-isopropylidenediphthalic anhydride, 4,4'-(hexafluoroisopropylidene)diphthalic anhydride, 3,4,9,10-perylenetetracarboxylic dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,3",4,4"-p-terphenyltetracarboxylic dianhydride, 3,3",4,4"-m-terphenyltetracarboxylic dianhydride, 2,3,6,7-anthracenetetracarboxylic dianhydride, 1,2,7,8-phenanethrenetetracarboxylic dianhydride, and the like. The above-mentioned aromatic tetracarboxylic dianhydrides may be used singly, or two or more species thereof may be used.

Further, in the present invention, the residue of a tetracarboxylic dianhydride having an aliphatic ring can be contained in the polyimide constituting the polyimide copolymer and the polyimide mixed resin to such an extent that the heat resistance of the polyimide copolymer and the polyimide mixed resin is not impaired. Specific examples of the tetracarboxylic dianhydride having an aliphatic ring include 2,3,5-tricarboxycyclopentyl acetic dianhydride, 1,2,3,4-cyclobutanetetracarboxylic dianhydride, 1,2,3,4-cyclopentanetetracarboxylic dianhydride, 1,2,3,5-cyclopentanetetracarboxylic dianhydride, 1,2,4,5-bicyclohexenetetracarboxylic dianhydride, 1,2,4,5-cyclohexanetetracarboxylic dianhydride, and 1,3,3a,4,5,9b-hexahydro-5-(tetrahydro-2,5-dioxo-3-furanyl)-naphtho[1,2-C] furane-1,3-dione. The above-mentioned tetracarboxylic dianhydrides may be used singly, or two or more species thereof may be used.

A molecular weight of the polyimide constituting the polyimide copolymer and the polyimide mixed resin of the present invention can be adjusted by making a tetracarboxylic acid component and a diamine component to be respectively used for synthesis equal in the number of moles to each other or by making either of these components excessive. It is also possible to make either of the tetracarboxylic acid component or the diamine component excessive and block a terminal of a polymer chain with a terminal blocking agent such as an acid component or an amine component. As the terminal blocking agent of the acid component, dicarboxylic acid or an anhydride thereof is preferably used, and as the terminal blocking agent of the amine component, monoamine is preferably used. In doing so, it is preferred that an acid equivalent of the tetracarboxylic acid component and an amine equivalent of the diamine component are equal in the number of moles to each other including terminal blocking agent of the acid component or the amine component.

When a mole ratio is adjusted so that the tetracarboxylic acid component is excessive or the diamine component is excessive, dicarboxylic acid such as benzoic acid, phthalic anhydride, tetrachlorophthalic anhydride and aniline or anhydrides thereof, or monoamine may be added as a terminal blocking agent.

In the present invention, a molar ratio of the tetracarboxylic acid component to the diamine component in the polyimide copolymer and the polyimide mixed resin can be appropriately adjusted so as to have a viscosity range of the resin composition to facilitate use of the resin composition in coating, and the molar ratio of the tetracarboxylic acid component to the diamine component is generally adjusted to the range of 100/100 to 100/95 or 100/100 to 95/100. If lacking a molar balance, a molecular weight of a resin is decreased, mechanical strength of a formed film is decreased, and an adhesive force tends to become low, and therefore it is preferred to adjust the molar ratio to such an extent that the adhesive force does not become low.

A polymerization method of the polyimide constituting the polyimide copolymer and the polyimide mixed resin of the present invention is not particularly limited. For example, when polymerization of polyamic acid serving as a polyimide precursor is performed, tetracarboxylic dianhydride and diamine are stirred at a temperature of 0 to 100° C. for 1 to 100 hours in an organic solvent to obtain a polyamic acid resin solution. When the polyimide resin is soluble in the organic solvent, after the polymerization of the polyamic acid, the polyamic acid is stirred as-is for 1 to 100 hours raising a temperature thereof to 120 to 300° C., and thereby the polyamic acid is converted to polyimide to obtain a polyimide resin solution. In this time, toluene, o-xylene, m-xylene or p-xylene may be added to a reaction solution to remove water to be produced by an imidization reaction by azeotropy of these solvent and water.

Further, the present invention includes a temporary-bonding adhesive, wherein the temporary-bonding adhesive is a resin composition containing (a) a resin (excluding a siloxane polymer represented by a general formula (2)), and at least one of (b-1) a siloxane polymer represented by a general formula (2) and (b-2) a compound represented by a general formula (3).

A type of the (a) resin (excluding a siloxane polymer including a structure represented by a general formula (2)) is not particularly limited, and any one which is generally usable for electronic material applications may be used. The reason for this is that as described later, when the resin composition contains at least one of (b-1) a siloxane polymer represented by a general formula (2) and (b-2) a compound represented by a general formula (3), heat resistance can be improved.

Examples of the (a) resin include, but not limited to, polymer resins such as polyimide-based resins, acrylic resins, acrylonitrile-based resins, butadiene-based resins, urethane-based resins, polyester-based resins, polyamide-based resins, polyamide-imide-based resins, epoxy-based resins, phenolic resins, silicone-based resins, and alicyclic resins. These resins may be used singly, or may be used in combination of two or more thereof.

The glass transition temperature of the (a) resin is preferably 100° C. or lower. When the glass transition temperature is 100° C. or lower, the adhesive can exhibit high tackiness when a substrate serving as an adherend is thermocompression bonded to an adhesive layer of the temporary-bonding adhesive of the present invention.

Further, a 1% weight Loss temperature of the (a) resin is preferably 300° C. or higher, and more preferably 350° C. or higher. When the 1% weight Loss temperature is 300° C. or higher, the voids are not generated in the adhesive layer during the step of processing a device and high heat resistance can be exhibited. The 1% weight Loss temperature of the present invention can be measured with use of a thermogravimetric analyzer (TGA). Measuring methods will be specifically described. A predetermined amount of a resin is put in TGA and held at 60° C. for 30 minutes to remove a water content which the resin has absorbed. Then, a temperature of the resin is raised at a rate of 5° C./min to 500° C. In the resulting weight Loss curve, a temperature at which a weight of the resin is decreased by 1% is determined and defined as a 1% weight Loss temperature.

The (a) resin of the present invention is preferably a polyimide resin. When the (a) resin is a polyimide resin, it can be easily achieved that the glass transition temperature is 100° C. or lower and that the 1% weight Loss temperature is 300° C. or higher.

The above-mentioned polyimide resin has at least an acid dianhydride residue and a diamine residue, and preferably includes a polysiloxane-based diamine residue represented by the general formula (5) in the diamine residue.

[Chemical Formula 15]

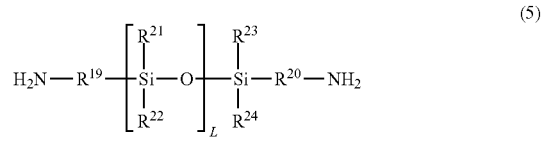

(5)

in which L is an integer of 1 to 100, $R^{19}$ and $R^{20}$ may be the same or different and represent an alkylene group having 1 to 30 carbon atoms or a phenylene group, and $R^{21}$ to $R^{24}$ may be the same or different and represent an alkyl group having 1 to 30 carbon atoms, a phenyl group, or a phenoxy group.

An average molecular weight of the polysiloxane-based diamine can be determined by calculating an amino group equivalent by performing neutralization titration of an amino group of polysiloxane-based diamine and doubling the amino group equivalent. For example, a predetermined amount of polysiloxane-based diamine serving as a specimen is taken and put into a beaker, and the polysiloxane-based diamine is dissolved in a predetermined amount of a mixed solution of isopropyl alcohol (hereinafter, referred to as IPA) and toluene in proportions of 1:1. To the resulting solution, a 0.1 N aqueous hydrochloric acid solution is added dropwise while stirring the solution, an amount of the 0.1 N aqueous hydrochloric acid solution added dropwise until reaching a neutralization point is determined, and thereby, the amino group equivalent can be calculated. A value obtained by doubling the amino group equivalent is the average molecular weight.

On the other hand, a molecular weight of the polysiloxane-based diamine used is calculated from its chemical structural formula for the cases of L=1 and L=10, and thereby, a relationship between the value of n and the molecular weight can be obtained as a relational expression of a linear function. By applying the above average molecular weight to the relational expression, an average value of the above n can be determined.

Further, since there may be cases where the polysiloxane-based diamine represented by the general formula (5) is a mixture where L is not a single value but a plurality of n exists, L represents an average value in the invention.

Specific examples of the polysiloxane-based diamine represented by the general formula (5) include α,ω-bis(3-aminopropyl)polydimethylsiloxane, α,ω-bis(3-aminopropyl)polydiethylsiloxane, α,ω-bis(3-aminopropyl) polydipropylsiloxane, α,ω-bis(3-aminopropyl) polydibutylsiloxane, α,ω-bis(3-aminopropyl) polydiphenoxysiloxane, α,ω-bis(2-aminoethyl) polydimethylsiloxane, α,ω-bis(2-aminoethyl) polydiphenoxysiloxane, α,ω-bis(4-aminobutyl) polydimethylsiloxane, α,ω-bis(4-aminobutyl) polydiphenoxysiloxane, α,ω-bis(5-aminopentyl)

polydimethylsiloxane, α,ω-bis(5-aminopentyl) polydiphenoxysiloxane, α,ω-bis(4-aminophenyl) polydimethylsiloxane, α,ω-bis(4-aminophenyl) polydiphenoxysiloxane, and the like. The polysiloxane-based diamines described above may be used singly, or two or more species thereof may be used. Among these polysiloxane-based diamines, polysiloxane-based diamines in which n is 2 or more are preferred, and such diamines can lower a glass transition temperature of a resin. The glass transition temperature of a resin is preferably 100° C. or lower, and the adhesive can exhibit high adhesiveness when thermocompression bonding.

The content of the residue of the polysiloxane-based diamine represented by the general formula (5) is preferably 30 mol % or more, and more preferably 40 mol % or more in all diamine residues. Because the residue of the polysiloxane-based diamine is in the above range, a glass transition temperature of the resin can be significantly lowered.

The polyimide resin may have the residue of aromatic diamine or the residue of alicyclic diamine. The content of the residue of the aromatic diamine or the residue of the alicyclic diamine is preferably 0.1 mol % or more and 70 mol % or less, and more preferably 0.1 mol % or more and 60 mol % or less in all diamine residues.

Specific examples of the aromatic diamine or the alicyclic diamine include 2,5-diaminophenol, 3,5-diaminophenol, 3,3'-dihydroxybenzidine, 4,4'-dihydroxy-3,3'-diaminophenyl propane, 4,4'-dihydroxy-3,3'-diaminophenyl hexafluoropropane, 4,4'-dihydroxy-3,3'-diaminophenyl sulfone, 4,4'-dihydroxy-3,3'-diaminophenyl ether, 3,3'-dihydroxy-4,4'-diaminophenyl ether, 4,4'-dihydroxy-3,3'-diaminophenyl propane methane, 4,4'-dihydroxy-3,3'-diaminobenzophenone, 1,3-bis(4-amino-3-hydroxy phenyl)benzene, 1,3-bis(3-amino-4-hydroxy phenyl)benzene, bis(4-(4-amino-3-hydroxy phenoxy)benzene)propane, bis(4-(3-amino-4-hydroxy phenoxy)benzene)sulfone, bis(4-(3-amino-4-hydroxy phenoxy))biphenyl, p-phenylene diamine, m-phenylene diamine, 2,5-diaminotoluene, 2,4-diaminotoluene, 3,5-diaminobenzoic acid, 2,6-diaminobenzoic acid, 2-methoxy-1,4-phenylene diamine, 4,4'-diaminobenzanilide, 3,4'-diaminobenzanilide, 3,3'-diaminobenzanilide, 3,3'-dimethyl-4,4'-diaminobenzanilide, 9,9-bis(4-aminophenyl)fluorene, 9,9-bis(3-aminophenyl)fluorene, 9,9-bis(3-methyl-4-aminophenyl)fluorene, 9,9-bis(3,5-dimethyl-4-aminophenyl)fluorene, 9,9-bis(3-methoxy-4-aminophenyl)fluorene, 9,9-bis(4-aminophenyl)fluorene-4-carboxylic acid, 9,9-bis(4-aminophenyl)fluorene-4-methyl, 9,9-bis(4-aminophenyl)fluorene-4-methoxy, 9,9-bis(4-aminophenyl)fluorene-4-ethyl, 9,9-bis(4-aminophenyl)fluorene-4-sulfone, 9,9-bis(4-aminophenyl)fluorene-3-carboxylic acid, 9,9-bis(4-aminophenyl)fluorene-3-methyl, 1,3-diaminocyclohexane, 2,2'-dimethyl benzidine, 3,3'-dimethyl benzidine, 3,3'-dimethoxy benzidine, 2,4-diaminopyridine, 2,6-diaminopyridine, 1,5-diaminonaphthalene, 2,7-diaminofluorene, p-amino benzylamine, m-amino benzylamine, 4,4'-bis(4-aminophenoxy)biphenyl, 4,4'-diaminodiphenyl ether, 3,3'-diaminodiphenyl ether, 3,4'-diaminodiphenyl ether, 4,4'-diaminodiphenyl sulfone, 3,3'-diaminodiphenyl sulfone, 3,3'-diaminodiphenyl methane, 4,4'-diaminodiphenyl methane, 4,4'-diaminodiphenyl sulfide, 3,3'-diamino benzophenone, 3,4'-diamino benzophenone, 4,4'-diamino benzophenone, 3,3'-dimethyl-4,4'-diaminodiphenyl methane, 1,3-bis(4-aminophenoxy)benzene, 1,3-bis(3-aminophenoxy)benzene, 1,4-bis(4-aminophenoxy)benzene, 1,4-bis(3-aminophenoxy)benzene, 2,2-bis[4-(4-aminophenoxyl)phenyl]propane, 2,2-bis[4-(3-aminophenoxyl)phenyl]propane, bis[4-(4-aminophenoxyl)phenyl]methane, bis[4-(3-aminophenoxyl)phenyl]methane, bis[4-(4-aminophenoxyl)phenyl]ether, bis[4-(3-aminophenoxyl)phenyl]ether, bis[4-(4-aminophenoxyl)phenyl]sulfone, bis[4-(3-aminophenoxyl)phenyl]sulfone, 2,2-bis[4-(4-aminophenoxyl)phenyl]hexafluoropropane, 1,4-diamino cyclohexane, 4,4'-methylene bis(cyclohexyl amine), 3,3'-methylene bis(cyclohexyl amine), 4,4'-diamino-3,3'-dimethyl dicyclohexyl methane, 4,4'-diamino-3,3'-dimethyl dicyclohexyl, benzidine, and the like. The aromatic diamines or the alicyclic diamines described above may be used singly, or two or more species thereof may be used.

Among these aromatic diamines and alicyclic diamines, aromatic diamines with a structure having high bendability are preferred, and specifically, 1,3-bis(3-aminophenoxy)benzene, 3,3'-diaminodiphenyl sulfone, 4,4'-diaminodiphenylether, 3,3'-diaminodiphenylether, and 3,3'-diaminobenzophenone are particularly preferred.

Among the aromatic diamines and alicyclic diamines, the aromatic diamines represented by a general formula (4) are preferably contained. When containing the aromatic diamines represented by a general formula (4), compatibility between the inorganic particles and the polyimide copolymer or the polyimide mixed resin described later can be improved to suppress the sedimentation of inorganic particles:

[Chemical Formula 16]

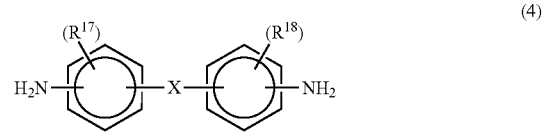

(4)

in which $R^{17}$ and $R^{18}$ may be the same or different and represent groups selected from among an alkyl group having 1 to 30 carbon atoms, an alkoxy group having 1 to 30 carbon atoms, a fluoroalkyl group having 1 to 30 carbon atoms, a hydroxyl group, halogen, a carboxyl group, a carboxylate ester group, a phenyl group, a sulfone group, a nitro group and a cyano group, and X represents a direct bond or the following bond structure.

[Chemical Formula 17]

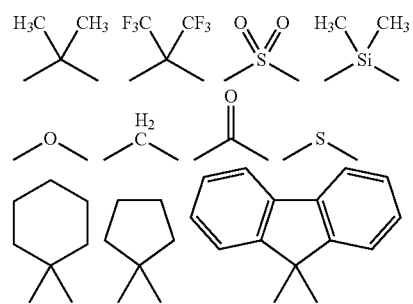

The halogen referred to herein refers to fluorine, chlorine, bromine, or iodine.

The content of the aromatic diamine represented by the general formula (4) is preferably 0.1 mol % or more and 40 mol % or less, and more preferably 0.1 mol % or more and 30 mol % or less in all diamine residues.

The above-mentioned polyimide resin preferably includes the residue of an aromatic tetracarboxylic dianhydride as the residue of the acid dianhydride. When the polyimide resin includes the residue of an aromatic tetracarboxylic dianhydride, the 1% weight Loss temperature is 300° C. or higher, and therefore the voids are not generated in the adhesive layer during the step of processing a device and high heat resistance can be exhibited.

Specific examples of the aromatic tetracarboxylic dianhydride include pyromellitic dianhydride, 3,3',4,4'-biphenyltetracarboxylic dianhydride, 2,2'-dimethyl-3,3',4,4'-biphenyltetracarboxylic dianhydride, 5,5'-dimethyl-3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4,4'-diphenylsulfone tetracarboxylic dianhydride, 2,3,3',4'-diphenylsulfone tetracarboxylic dianhydride, 3,3',4,4'-diphenylsulfoxide tetracarboxylic dianhydride, 3,3',4,4'-diphenylsulfide tetracarboxylic dianhydride, 3,3',4,4'-diphenylmethylene tetracarboxylic dianhydride, 4,4'-isopropylidenediphthalic anhydride, 4,4'-(hexafluoroisopropylidene)diphthalic anhydride, 3,4,9,10-perylenetetracarboxylic dianhydride, 2,3,6,7-naphthalenecarboxylic dianhydride, 1,4,5,8-naphthalenetetracarboxylic dianhydride, 1,2,5,6-naphthalenetetracarboxylic dianhydride, 3,3",4,4"-p-terphenyltetracarboxylic dianhydride, 3,3",4,4"-m-terphenyltetracarboxylic dianhydride, 2,3,6,7-anthracenetetracarboxylic dianhydride, 1,2,7,8-phenanethrenetetracarboxylic dianhydride, and the like. The above-mentioned aromatic tetracarboxylic dianhydrides may be used singly, or two or more species thereof may be used.

Further, a tetracarboxylic dianhydride having an aliphatic ring can be contained to such an extent that the heat resistance of the polyimide resin is not impaired. Specific examples of the tetracarboxylic dianhydride having an aliphatic ring include 2,3,5-tricarboxycyclopentyl acetic dianhydride, 1,2,3,4-cyclobutanetetracarboxylic dianhydride, 1,2,3,4-cyclopentanetetracarboxylic dianhydride, 1,2,3,5-cyclopentanetetracarboxylic dianhydride, 1,2,4,5-bicyclohexenetetracarboxylic dianhydride, 1,2,4,5-cyclohexanetetracarboxylic dianhydride, and 1,3,3a,4,5,9b-hexahydro-5-(tetrahydro-2,5-dioxo-3-furanyl)-naphtho[1,2-C]furane-1,3-dione. The above-mentioned tetracarboxylic dianhydrides may be used singly, or two or more species thereof may be used.

A molecular weight of the polyimide resin can be adjusted by making a tetracarboxylic acid component and a diamine component to be respectively used for synthesis equal in the number of moles to each other or by making either of these components excessive. It is also possible to make either of the tetracarboxylic acid component or the diamine component excessive and block a terminal of a polymer chain with a terminal blocking agent such as an acid component or an amine component. As the terminal blocking agent of the acid component, dicarboxylic acid or an anhydride thereof is preferably used, and as the terminal blocking agent of the amine component, monoamine is preferably used. In doing so, it is preferred that an acid equivalent of the tetracarboxylic acid component and an amine equivalent of the diamine component are equal in the number of moles to each other including terminal blocking agent of the acid component or the amine component.

When a mole ratio is adjusted so that the tetracarboxylic acid component is excessive or the diamine component is excessive, dicarboxylic acid such as benzoic acid, phthalic anhydride, tetrachlorophthalic anhydride and aniline or anhydrides thereof, or monoamine may be added as a terminal blocking agent.

A molar ratio of the tetracarboxylic acid component to the diamine component in the polyimide resin can be appropriately adjusted so as to have a viscosity range of the resin composition to facilitate use of the resin composition in coating, and the molar ratio of the tetracarboxylic acid component to the diamine component is generally adjusted to the range of 100/100 to 100/95 or 100/100 to 95/100. If lacking a molar balance, a molecular weight of a resin is decreased, mechanical strength of a formed film is decreased, and an adhesive force tends to become low, and therefore it is preferred to adjust the molar ratio to such an extent that the adhesive force does not become low.

A polymerization method of the polyimide resin of the present invention is not particularly limited. For example, when polymerization of polyamic acid serving as a polyimide precursor is performed, tetracarboxylic dianhydride and diamine are stirred at a temperature of 0 to 100° C. for 1 to 100 hours in an organic solvent to obtain a polyamic acid resin solution. When the polyimide resin is soluble in the organic solvent, after the polymerization of the polyamic acid, the polyamic acid is stirred as-is for 1 to 100 hours raising a temperature thereof to 120 to 300° C., and thereby the polyamic acid is converted to polyimide to obtain a polyimide resin solution. In this time, toluene, o-xylene, m-xylene or p-xylene may be added to a reaction solution to remove water to be produced by an imidization reaction by azeotropy of these solvent and water.

The polyimide resin may be a polyimide, or may be a polyamic acid which is a precursor of the polyimide. The polyimide resin may be a polyimide precursor a part of which is cyclized and imidized.

The (b-1) siloxane polymer represented by a general formula (2) will be described.

[Chemical Formula 18]

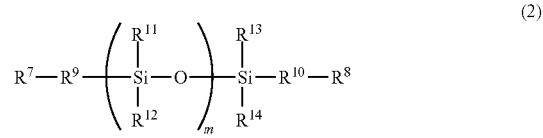

(2)

in which m is an integer of 10 to 100, $R^7$ and $R^8$ may be the same or different and represent a monovalent organic group having 0 to 3 nitrogen atoms, $R^9$ and $R^{10}$ may be the same or different and represent an alkylene group having 1 to 30 carbon atoms or a phenylene group, and $R^{11}$ to $R^{14}$ may be the same or different and represent an alkyl group having 1 to 30 carbon atoms, an alkylene group having 1 to 30 carbon atoms, an alkoxy group having 1 to 30 carbon atoms, a phenyl group, or a phenoxy group.

In addition, the alkoxy group having 1 to 30 carbon atoms does not include a polyoxyalkylene structure.

$R^7$ and $R^8$ may be the same or different and represent a monovalent organic group having 1 to 30 carbon atoms and 0 to 3 nitrogen atoms. For example, structures having an alkyl group, an alkylene group, an alkoxy group, a phenyl group, a phenoxy group, an amino group, a carboxyl group, a hydroxyl group, an epoxy group, an oxetane group, an ether group, an aralkyl group, an amide group, an imide group, a nitro group or an ester group, can be used.

In the general formula (2), m is an integer of 10 to 100. By containing the siloxane polymer in which m is 10 to 100, the adhesiveness of the surface of the adhesive layer obtained by applying a resin composition onto a wafer and drying the resin composition can be lowered, and therefore it is possible that the semiconductor circuit formation substrate and the support substrate are bonded to each other and then the semiconductor circuit formation substrate and the support substrate are de-bonded off from each other by mechanically applying a force at room temperature under a mild condition. Further, the semiconductor circuit formation substrate and the support substrate can also be de-bonded off from each other by dissolving the adhesive layer under a mild condition of room temperature using a rework solvent described later or the like.

Further, by containing the siloxane polymer in which m is 10 to 100, heat resistance of the surface of the adhesive layer can be improved, it is possible to prevent voids from being generated in the adhesive layer during a step of processing a device after bonding a semiconductor circuit formation substrate to a support substrate.

From the viewpoint of heat resistance, $R^7$ and $R^8$ are preferably a structure having an aromatic ring or aromatic heterocyclic structure. When the $R^7$ and the $R^8$ are a structure having an aromatic ring or aromatic heterocyclic structure, it is possible to more prevent voids from being generated in the adhesive layer during a step of processing a device after bonding a semiconductor circuit formation substrate to a support substrate. Specific examples of the $R^7$ and $R^8$ include the following structures, but are not limited to these structures.

[Chemical Formula 19]

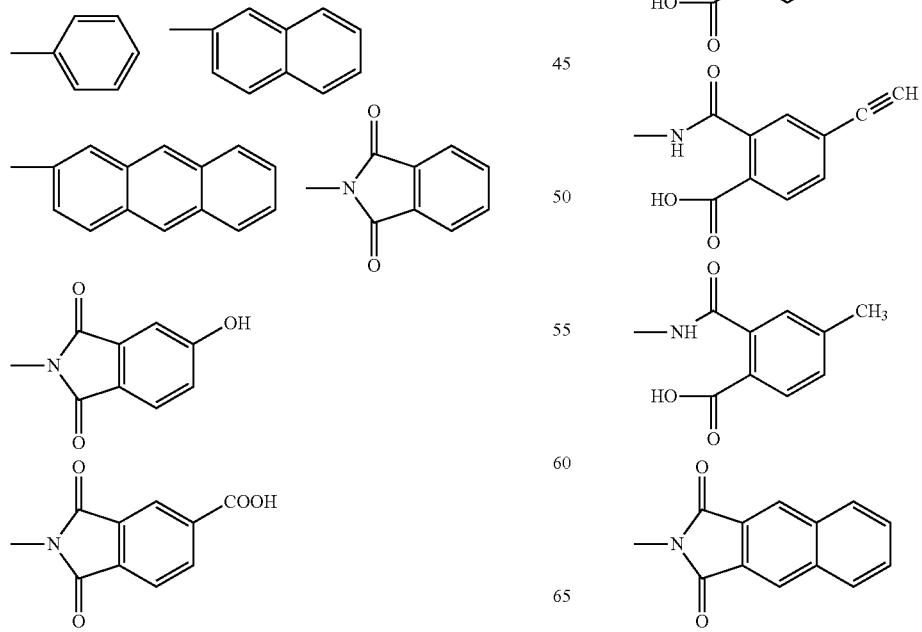
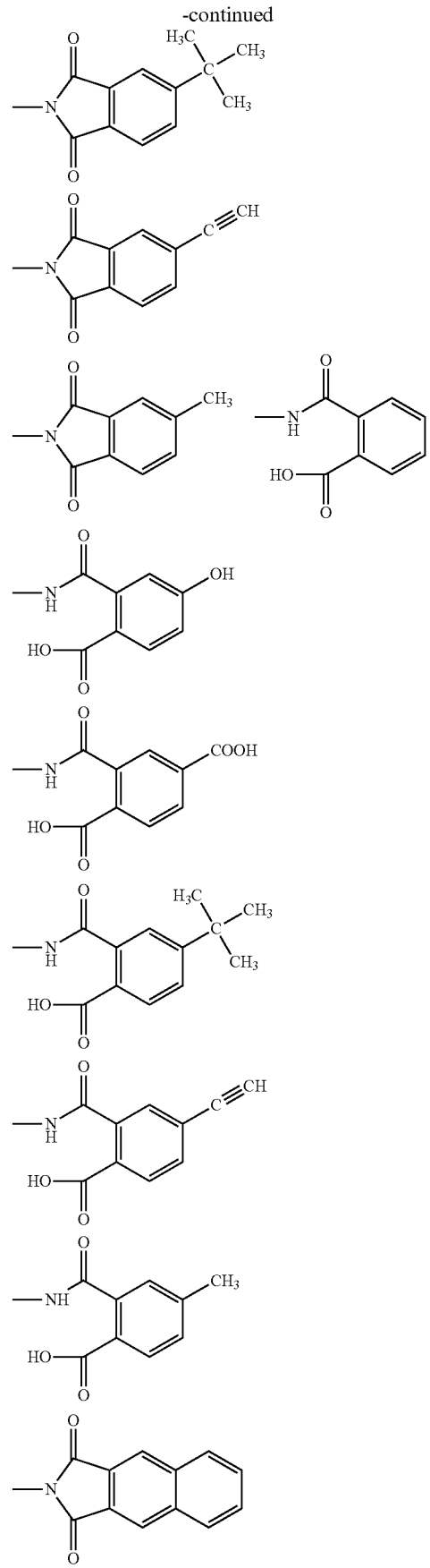

-continued

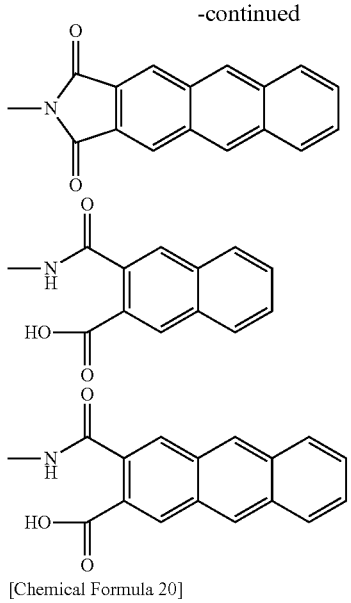

[Chemical Formula 20]

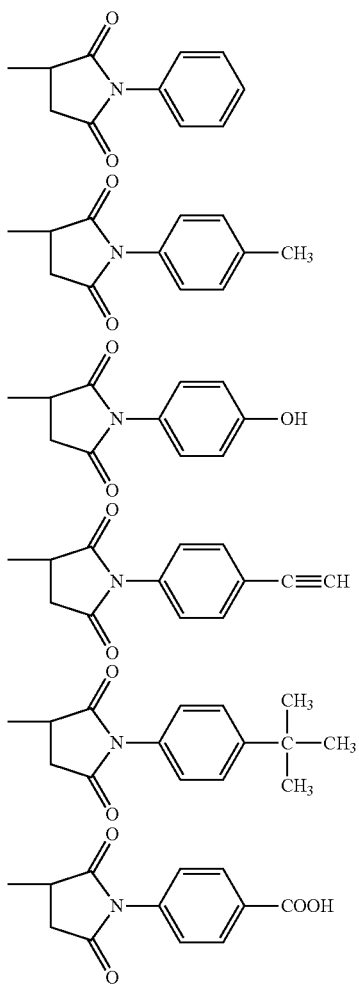

The content of the (b-1) siloxane polymer represented by the general formula (2) is preferably 0.01 to 30 wt % with respect to the (a) resin. The content is more preferably 0.1 wt % or more and 15 wt % or less. By setting the content to 0.01 wt %, releasability and heat resistance can be improved, and by setting the content to 30 wt % or less, adhesiveness between the adhesive layer and the support substrate can be maintained. Further, the (b-1) siloxane polymer represented by the general formula (2) may be added during the polymerization of the (a) resin, or may be added after the polymerization of the (a) resin.

The (b-2) compounds represented by the general formula (3) will be described.

[Chemical Formula 21]

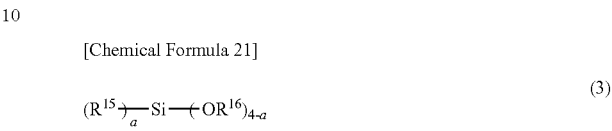

in which $R^{15}$ represents a monovalent organic group having 2 to 20 carbon atoms and 1 to 3 nitrogen atoms, $R^{16}$ represents hydrogen, an alkyl group having 1 to 20 carbon atoms, or an aromatic group, and a represents an integer of 0 to 4.

By containing the (b-2) compound represented by the general formula (3), the adhesiveness between the adhesive layer and the support substrate can be improved, and therefore heat resistance can be improved, it is possible to prevent voids from being generated in the adhesive layer during a step of processing a device after bonding a semiconductor circuit formation substrate to a support substrate.

When the adhesive layer does not contain the (b-1) siloxane polymer represented by the general formula (2) and contains only the (b-2) compound represented by the general formula (3), the adhesiveness of the surface of the adhesive layer is intensive, and the semiconductor circuit formation substrate is hardly de-bonded by applying a mechanical force. However, the semiconductor circuit formation substrate can be de-bonded by dissolving the adhesive layer under a mild condition of room temperature using a rework solvent described later and the like.

$R^{15}$ represents a monovalent organic group having 2 to 20 carbon atoms and 1 to 3 nitrogen atoms. As such an organic group, for example, a structure having an amino group, an isocyanate group, or a ureide group can be used. Specific examples of the compound represented by the general formula (3) include the following structures, but are not limited to these structures.

[Chemical Formula 22]

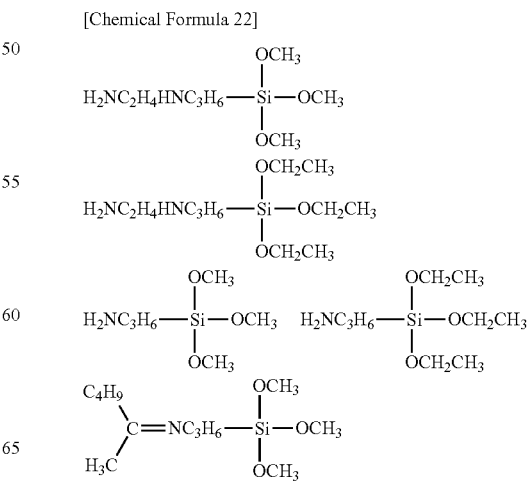

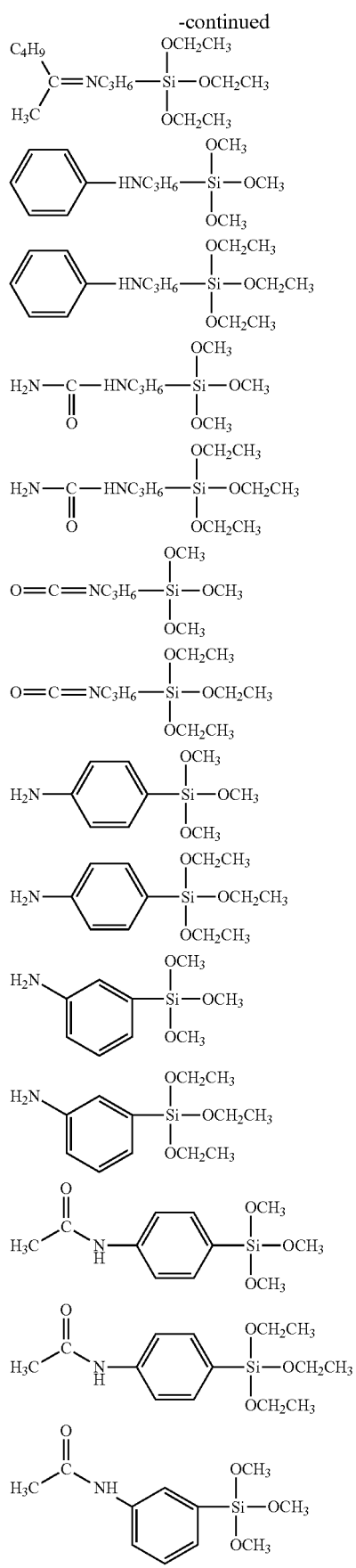
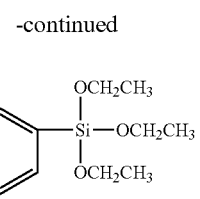
Further, from the viewpoint of heat resistance, $R^{15}$ is preferably a structure having an aromatic ring or aromatic heterocyclic structure. Preferred specific examples of the compound represented by the general formula (3) include the following structures, but are not limited these structures.
[Chemical Formula 23]
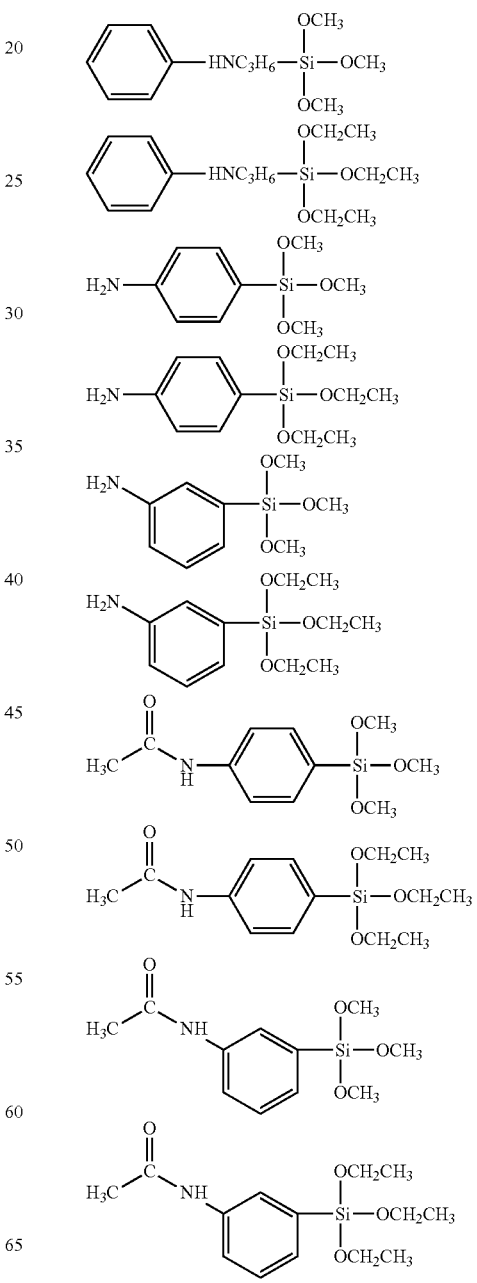

The content of the (b-2) compound represented by the general formula (3) is preferably 0.01 to 30 wt % with respect to the (a) resin. The content is more preferably 0.1 wt % or more and 15 wt % or less. When the content of the compound is set to 0.1 wt %, there is an effect of more suppressing generation of the voids, and when the content is set to 15 wt % or less, an increase in flowability of the adhesive layer is suppressed, and consequently, generation of the voids in the adhesive layer during the step of processing a device, can be more suppressed. Further, the (b-2) compound represented by the general formula (3) may be added during the polymerization of the (a) resin, or may be added after the polymerization of the (a) resin.

The temporary-bonding adhesive of the present invention may contain a solvent. Solvents, for example, polar aprotic solvents such as N-methyl-2-pyrrolidone, γ-butyrolactone, N,N-dimethylformamide, N,N-dimethylacetamide, and dimethyl sulfoxide; ethers such as tetrahydrofuran, dioxane, and propylene glycol monomethyl ether; ketones such as acetone, methyl ethyl ketone, and diisobutyl ketone; esters such as ethyl acetate, propylene glycol monomethyl ether acetate, and ethyl lactate; and aromatic hydrocarbons such as toluene, and xylene, may be used singly, or two or more species thereof may be used.

An SP value of the solvent contained in the temporary-bonding adhesive of the present invention is preferably 7.5 to 9.0. The SP value is more preferably 7.5 to 8.0. When the polyimide resin is used for the polyimide copolymer, the polyimide mixed resin, or the (a) resin, since the polyimide resin contains a low polar polysiloxane-based diamine residue and a residue including a high polar imide group and a high polar aromatic group, the storage stability is poor and the resin composition tends to cause phase separation. However, by containing a solvent in which the SP value is 7.5 to 9.0, the phase separation of the resin composition does not occur and good storage stability can be exhibited.

Examples of the solvent having the SP value of 7.5 to 9.0 include methyl acetate (SP value; 8.8), ethyl acetate (SP value; 8.7), 3-methoxybutyl acetate (SP value; 8.7), diethylene glycol methyl ethyl ether (SP value; 8.2), diethylene glycol dimethyl ether (SP value; 8.1), dipropylene glycol methyl ether acetate (SP value; 8.7), methyl ethyl ketone (SP value; 9.0), dipropylene glycol dimethyl ether (SP value; 7.8), dipropylene glycol methyl-n-propyl ether (SP value; 8.0), and the like. These solvents may be used singly, or two or more species thereof may be used.

There are various methods concerning how to determine the SP value of a solvent. In the present specification, an SP value calculated from an estimation method proposed by Fedors will be used. In the Fedors method, total cohesion energy and a total molar volume of a whole substance are calculated from cohesion energy and a molar volume of a structural unit of a substance, and the square root of a value obtained by dividing the total cohesion energy by the total molar volume is take as an SP value.

A solvent represented by the general formula (6) is preferred from the viewpoint of the solubility of the polyimide resin used for the polyimide copolymer, the polyimide mixed resin, or the (a) resin.

[Chemical Formula 24]

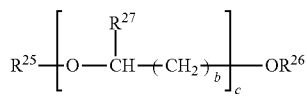

(6)

in which $R^{25}$ and $R^{26}$ independently represent hydrogen, alkyl groups having 1 to 12 carbon atoms, an acetyl group, or aromatic groups, $R^{27}$ represents hydrogen or a methyl group, b is either 0, 1 or 2, and c is an integer of 1 to 3.

Specific examples of the solvents represented by the general formula (6) include, but not limited to, propylene glycol mono-t-butyl ether, ethylene glycol mono-t-butyl ether, propylene glycol mono-n-butyl ether, propylene glycol monopropyl ether, propylene glycol monoethyl ether, ethylene glycol mono-n-butyl ether, ethylene glycol monopropyl ether, dipropylene glycol dimethyl ether, dipropylene glycol diethyl ether, dipropylene glycol dipropyl ether, dipropylene glycol di-n-butyl ether, dipropylene glycol di-t-butyl ether, dipropylene glycol monomethyl ether, dipropylene glycol monoethyl ether, dipropylene glycol monopropyl ether, dipropylene glycol mono-n-butyl ether, tripropylene glycol monomethyl ether, tripropylene glycol monoethyl ether, tripropylene glycol monopropyl ether, diethylene glycol methyl ethyl ether, and diethylene glycol dimethyl ether.

As the solvent contained in the temporary-bonding adhesive of the present invention, solvents which are represented by the general formula (6) and have the SP value of 7.5 to 9.0, are more preferred. Examples of such solvents include dipropylene glycol dimethyl ether (SP value; 7.8), dipropylene glycol methyl-n-propyl ether (SP value; 8.0), diethylene glycol methyl ethyl ether (SP value; 8.2), diethylene glycol dimethyl ether (SP value; 8.1), and the like. Dipropylene glycol dimethyl ether (SP value; 7.8) and dipropylene glycol methyl-n-propyl ether (SP value; 8.0), in which the SP values are 7.5 to 8.0, are more preferred.

Further, other solvents may be added to such an extent that the effects of the storage stability and solubility of the polyimide copolymer, the polyimide mixed resin or the (a) resin is not impaired. Examples thereof include, but not limited to, amide-based polar solvents such as N-methyl-2-pyrrolidone, N,N-dimethylacetamide, N,N-dimethylformamide, and 1,3-dimethyl-2-imidazoline; lactone-based polar solvents such as β-propiolactone, γ-butyrolactone, γ-valerolactone, δ-valerolactone, γ-caprolactone, and ε-caprolactone; and ethyl lactate and the like.

In the polymerization method of the siloxane polyimide resin described above, it is also possible to leave the organic solvent, which has been used as a polymerization solvent, as a solvent contained in the temporary-bonding adhesive without being removed from a polymerization solution.

The temporary-bonding adhesive of the present invention preferably contains inorganic particles. By containing the inorganic particles, the heat resistance of the resin composition can be improved. Specific examples of a material of the inorganic particles include silica, alumina, titanium oxide, quartz powder, magnesium carbonate, potassium carbonate, barium sulfate, mica, talc and the like. Further, the inorganic particles may be added during the polymerization of the polyimide copolymer, the polyimide mixed resin, or the (a) resin, or may be added after the polymerization.

The content of the inorganic particles is preferably 0.1 wt % or more and 40 wt % or less with respect to the polyimide copolymer, the polyimide mixed resin, or the (a) resin. The content is more preferably 0.1 wt % or more and 20 wt % or less.

When the polyimide resin used for the polyimide copolymer, the polyimide mixed resin, or the (a) resin, is a polyamic acid resin, the polyamic acid resin is applied onto a substrate such as a wafer or glass and dried to form a coated film, and then the polyamic acid resin is converted to polyimide by a heat treatment. A temperature of 240° C. or higher is required for conversion from the polyimide precursor to the polyimide. However, when an imidization catalyst is contained in the temporary-bonding adhesive, imidization becomes possible at a lower temperature and in a shorter time. Specific examples of the imidization catalyst include, but not limited to, pyridine, trimethylpyridine, β-picoline, quinoline, isoquinoline, imidazole, 2-methylimidazole, 1,2-dimethylimidazole, 2-phenylimidazole, 2,6-lutidine, triethylamine, m-hydroxybenzoic acid, 2,4-dihydroxybenzoic acid, p-hydroxyphenylacetic acid, 4-hydroxyphenylpropionic acid, p-phenolsulfonic acid, p-aminophenol, p-aminobenzoic acid and the like.

The content of the imidization catalyst is preferably 3 wt % or more, and more preferably 5 wt % or more with respect to 100 wt % of the polyimide copolymer, the polyimide mixed resin, or the polyimide resin. When containing the imidization catalyst in an amount of 3 wt % or more, imidization can be completed even by a heat treatment at lower temperature. Further, the content of the imidization catalyst is preferably 10 wt % or less, and more preferably 8 wt % or less. By setting the content of the imidization catalyst to 10 wt % or less, it is possible to minimize an amount of the imidization catalyst which remains in a polyimide-based resin layer after the heat treatment to suppress generation of volatile portions. Further, the imidization catalyst may be added during the polymerization of the polyimide copolymer, the polyimide mixed resin, or the (a) resin, or may be added after the polymerization.

Other resins may be added to the temporary-bonding adhesive of the present invention to such an extent that the effect of the present invention is not impaired. Further, a surfactant, a silane coupling agent or the like may be added for the purpose of improving characteristics such as tackiness, heat resistance, coating properties, and storage stability. Further, other resins, the surfactant or the silane coupling agent may be added during the polymerization of the polyimide copolymer, the polyimide mixed resin, or the (a) resin, or may be added after the polymerization.

The temporary-bonding adhesive of the present invention can be used for manufacturing of a semiconductor device. Specifically, the temporary-bonding adhesive can be used for manufacturing of a semiconductor device which includes the step of reducing a thickness of the semiconductor circuit formation substrate to at least 1 μm and at most 100 μm. Examples thereof include manufacturing of a semiconductor device in which a semiconductor chip is laminated while being connected through TSV (through-silicon via) in order to achieve higher levels of integration and greater packaging density of the semiconductor device. A silicon substrate is generally used for the semiconductor circuit formation substrate.

When the thickness of the silicon substrate is reduced to at least 1 μm and at most 100 μm, since it is difficult to carry the silicon substrate, a semiconductor circuit formation substrate is bonded to a support substrate such as a silicon substrate or a glass substrate using a temporary-bonding adhesive to prepare a wafer work piece. A surface where a circuit is not formed (backside) of the semiconductor circuit formation substrate of the wafer work piece is polished to reduce a thickness, and thereafter the semiconductor circuit formation substrate is subjected to device processing. Thereafter, the semiconductor circuit formation substrate is de-bonded off from the support substrate. The temporary-bonding adhesive of the present invention can be suitably used as an adhesive in manufacturing of a semiconductor device including any one of the above-mentioned steps.

Examples of applying the temporary-bonding adhesive onto the support substrate include spin coating, roll coating, screen printing, slit die coating, and the like. By continuously or intermittently heat-treating the temporary-bonding adhesive at 180 to 450° C. for 1 to 3 hours after applying the adhesive and drying it at 100 to 150° C., an adhesive layer having excellent adhesiveness and excellent heat resistance can be prepared. Further, using a laminated film formed by applying the temporary-bonding adhesive onto a base film subjected to release treatment, drying and laminating the adhesive, an applied film of the temporary-bonding adhesive may be transferred to a silicon substrate or glass substrate serving as a support substrate to be laminated thereon. When the temporary-bonding adhesive is further heat-treated at 180 to 450° C. for 1 to 3 hours after lamination of the temporary-bonding adhesive, an adhesive layer having excellent adhesiveness and excellent heat resistance can be prepared.

In the present invention, the temporary-bonding adhesive may be not only applied onto the support substrate to be laminated thereon, but also applied onto the semiconductor circuit formation substrate to be laminated thereon, or using the laminated film, the applied film of the temporary-bonding adhesive may be transferred to the semiconductor circuit formation substrate to be laminated thereon. Further, a layer made of another resin composition may be present on a support substrate side or semiconductor circuit formation substrate side of the adhesive layer.

Examples of methods of de-bonding off the semiconductor circuit formation substrate include a thermal slide off method, a laser lift off method, a mechanical de-bonding method at room temperature, a solvent release method at room temperature and the like. The temporary-bonding adhesive of the present invention can be suitably used in the mechanical de-bonding method at room temperature or the solvent release method at room temperature. The mechanical de-bonding method at room temperature is a method in which the semiconductor circuit formation substrate is gradually de-bonded off from an end of the substrate in a mechanical way at room temperature. The solvent release method at room temperature is a method in which the support substrate has been provided with holes for a solvent passage in advance, and an adhesive film is dissolved in a solvent to de-bond off the semiconductor circuit formation substrate. When the polyimide resin is used for the polyimide copolymer, the polyimide mixed resin, or the (a) resin, a rework solvent described later is preferably used for a solvent to be used for the solvent release method.

The manufacturing method of the present invention may include a step of reworking an adhesive layer or a residue of an adhesive layer respectively remaining on the semiconductor circuit formation substrate or the support substrate with an organic solvent, an alkaline aqueous solution or the like after the step of de-bonding off the semiconductor circuit formation substrate from the support substrate.

When the polyimide resin is used for the polyimide copolymer, the polyimide mixed resin, or the (a) resin, it is preferred to use a rework solvent containing (A) an amine-based solvent and (B) a solvent represented by the general formula (6) as the rework solvent:

[Chemical Formula 25]

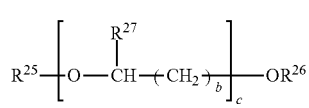

(6)

in which $R^{25}$ and $R^{26}$ independently represent hydrogen, alkyl groups having 1 to 12 carbon atoms, an acetyl group, or aromatic groups, $R^{27}$ represents hydrogen or a methyl group, b is either 0, 1 or 2, and c is an integer of 1 to 3.

The (A) amine-based solvent has the effect of ring-opening an imide group to make it easily dissolve in the rework solvent, and therefore a washing time can be shortened. Amine-based solvents including primary amines and secondary amines are preferred for ring-opening the imide group, and specific examples thereof include, but not limited to, monomethanolamine, dimethanolamine, monoethanolamine, dimethanolamine, dimethylamine, monopropanolamine, isopropanolamine, isopropylamine, diisopropylamine and the like. More preferred ones are amine-based solvents including primary amines, and specific examples thereof include, but not limited to, monomethanolamine, monoethanolamine, monopropanolamine, isopropanolamine, isopropylamine and the like.

From the viewpoint of solubility of the polyimide copolymer, the polyimide mixed resin or the polyimide resin, the rework solvent preferably contains the solvent represented by the general formula (6), and specific examples of such solvents include, but not limited to, propylene glycol mono-t-butyl ether, ethylene glycol mono-t-butyl ether, propylene glycol mono-n-butyl ether, propylene glycol monopropyl ether, propylene glycol monoethyl ether, ethylene glycol mono-n-butyl ether, ethylene glycol monopropyl ether, dipropylene glycol dimethyl ether, dipropylene glycol diethyl ether, dipropylene glycol dipropyl ether, dipropylene glycol di-n-butyl ether, dipropylene glycol di-t-butyl ether, dipropylene glycol monomethyl ether, dipropylene glycol monoethyl ether, dipropylene glycol monopropyl ether, dipropylene glycol mono-n-butyl ether, tripropylene glycol monomethyl ether, tripropylene glycol monoethyl ether, tripropylene glycol monopropyl ether, diethylene glycol methyl ethyl ether, and diethylene glycol dimethyl ether.

Further, solvents which are represented by the general formula (6) and have the SP value of 7.5 to 9.0, are more preferred. Examples of such solvents include dipropylene glycol dimethyl ether (SP value; 7.8), dipropylene glycol methyl-n-propyl ether (SP value; 8.0), diethylene glycol methyl ethyl ether (SP value; 8.2), diethylene glycol dimethyl ether (SP value; 8.1), and the like. Dipropylene glycol dimethyl ether (SP value; 7.8) and dipropylene glycol methyl-n-propyl ether (SP value; 8.0), in which the SP values are 7.5 to 8.0, are more preferred.

The rework solvent used in the present invention preferably contains an amide-based polar solvent in addition to the (A) and the (B). The amide-based polar solvent has the effect of bringing the (A) and the (B) into a compatibly mixed state and improving the storage stability of the rework solvent. Polar solvents including a tertiary amide having excellent storage stability are preferred for the amide-based polar solvent. Specific examples of the polar solvents include, but not limited to, N-methyl-2-pyrrolidone, N,N-dimethylacetamide, N,N-dimethylformamide, 1,3-dimethyl-2-imidazoline and the like.

Further, the rework solvent may contain an aqueous solution of sodium hydroxide, sodium hydrogen carbonate, potassium hydroxide or tetramethylammonium hydroxide, or an organic solvent such as dimethylsulfoxide, as required.

The rework solvent can be suitably used as a solvent to be used in the solvent release-method at room temperature.

EXAMPLES

The present invention will be described below by way of examples. The present invention is not limited to these examples. Evaluation methods of measurement of glass transition temperature, measurement of 1% weight loss temperature, storage stability, adhesiveness evaluation, heat resistance evaluation, backgrinding evaluation, de-bonding evaluation, rework evaluation, and sedimentation evaluation of inorganic particles, will be described.

(1) Measurement of Glass Transition Temperature

Polyamic acid resin solutions described in the following Synthesis Examples 1 and 26 to 32 (PA1, PA26 to PA32) was applied onto a gloss surface of an electrolytic copper foil of 18 μm in thickness so as to be 20 μm in thickness using a bar coater, and then the solution was dried at 80° C. for 10 minutes and at 150° C. for 10 minutes and further heat-treated at 250° C. for 10 minutes in a nitrogen atmosphere to be converted to a polyimide, and thereby a polyimide-laminated copper foil was obtained. Then, the whole area of the copper foil of the obtained polyimide-laminated copper foil was etched with a ferric chloride solution to obtain a single film of polyimide.

About 10 mg of the obtained single film of polyimide was packed in an aluminum standard container and measured using a differential scanning calorimeter DSC-50 (manufactured by Shimadzu Corporation) (DSC method), and a glass transition temperature was calculated from an inflection point of the resulting DSC curve. After the single film was preliminarily dried at 80° C. for 1 hour, measurement was performed at a temperature raising rate of 20° C./min.

(2) Measurement of 1% Weight Loss Temperature

About 15 mg of the single film of polyimide obtained in the above description was packed in an aluminum standard container and measured using a thermogravimetric analyzer TGA-50 (manufactured by Shimadzu Corporation). With respect to measuring conditions, the single film was held at 60° C. for 30 minutes, and then a temperature of the single film was raised at a temperature raising rate of 5° C./min to 500° C.

From the resulting weight Loss curve, a temperature at which a weight of the single film was decreased by 1% was read, and this temperature was defined as a 1% weight Loss temperature.

(3) Storage Stability

The polyamic acid resin solution obtained in each Production Example was stored at 23° C., and a separating property of the solution was visually observed. Rating criteria are as follows.

S: Separation does not occur during storage of two weeks or more
A: Separation occurs during 1 to 2 weeks
B: Separation occurs within 1 week
C: Separation occurs within 3 days (4) Adhesiveness Evaluation The polyamic acid resin solution obtained in each Production Example was applied onto a 8-inch silicon wafer of 750 μm in thickness (manufactured by Shin-Etsu Chemical Co., Ltd.) with a spin coater the number of revolutions of which was adjusted so that the applied polyamic acid resin solution has a thickness of 20 μm after drying and imidization, and the polyamic acid resin solution was heat-treated at 120° C. for 10 minutes to be dried, and heat-treated at 350° C. for 1 hour to be completely imidized, and thereby an adhesive layer-laminated silicon substrate was obtained.

On the adhesive layer-laminated silicon substrate prepared in the above way, a 8-inch alkali-free glass substrate of 0.7 mm in thickness (manufactured by Corning Incorporated) was overlaid, and was press-bonded for 5 minutes at a load of 2000 N using a hot press machine whose upper plate and lower plate were set at 180° C. to obtain a glass substrate-laminated silicon substrate.

In this case, when the glass substrate could be laminated on the silicon substrate, the adhesiveness was rated as "A", and when the glass substrate could not be laminated, the adhesiveness was rated as "C".

Further, the obtained glass substrate-laminated silicon substrate was visually observed from a glass side to evaluate the presence or absence of voids. Rating criteria are as follows.

A: Void is not present
B: Voids of 1 cm or less are present
C: Voids of 1 cm or more are present (5) Heat Resistances Evaluation The glass substrate-laminated silicon substrate which was evaluated on the adhesiveness in the above description was heat-treated at 350° C. for 2 hours and then was visually observed from a glass side to evaluate the presence or absence of voids. Rating criteria are as follows.

A: Void is not present
B: Voids of 1 cm or less are present
C: Voids of 1 cm or more are present (6) Evaluation of Backgrinding of Silicon Substrate The glass substrate-laminated silicon substrate which was evaluated on the heat resistance in the above description was set on a grinder DAG810 (manufactured by DISCO Corporation), and a silicon substrate was polished to a thickness of 100 μm. The silicon substrate after grinding was visually observed to evaluate the presence or absence of fractures or cracks.

(7) De-bonding Evaluation

1. Mechanical De-bonding Method at Room Temperature

A dicing tape was bonded to the silicon substrate of the glass substrate-laminated silicon substrate subjected to backgrinding in the above description using a dicing frame, and the surface of the dicing tape was set on a suction pad by vacuum suction, and the glass substrate was de-bonded off at room temperature by lifting one point of the glass substrate with tweezers.

2. Solvent-De-bonding Method at Room Temperature

Using a substrate obtained by providing the above-mentioned 8-inch alkali-free glass substrate with holes for a solvent passage, a glass substrate-laminated silicon substrate was prepared. Thereafter, the glass substrate-laminated silicon substrate was immersed in the rework solvent obtained in Production Example 47 at 23° C. for 10 minutes, and the substrate was de-bonded off with a hand.

Rating criteria of de-bonding evaluation are as follows.

A: Substrate can be de-bonded by both of 1. Mechanical de-bonding method and 2. Solvent method.
B1: Substrate can be de-bonded only by 1. Mechanical de-bonding method at room temperature.
B2: Substrate can be de-bonded only by 2. Solvent release method at room temperature.
C: Substrate can be de-bonded neither by 1. Mechanical de-bonding method nor 2. Solvent release method.

(8) Rework Evaluation

The adhesive layer adhering to the silicon substrate de-bonded off in the above description was reworked at 23° C. for 10 minutes with the rework solvent obtained in Production Example 46, and a state of solubility of the adhesive layer was visually observed. Rating criteria are as follows.

A: There is no residue of the adhesive layer
B: Adhesive layer is dissolved but a residue remains on the substrate
C: Adhesive layer is not dissolved (9) Sedimentation Evaluation of Inorganic Particles The polyamic acid resin solutions obtained in Production Examples 10 to 45 were stored at 23° C., and the presence or absence of inorganic particle sedimentation of each solution was visually observed. Rating criteria are as follows.

S: Sedimentation does not occur during storage of four weeks or more
A: Sedimentation occurs during 2 to 4 weeks
B: Sedimentation occurs within 2 weeks
C: Sedimentation occurs within 1 week

(10) Measurement of Average Molecular Weight and Calculation of Value of n of Polysiloxane-Based Diamine 5 g of polysiloxane-based diamine serving as a specimen is taken and put into a beaker, and to this, 50 ml of a mixed solution of IPA and toluene in proportions of 1:1 was added to dissolve the polysiloxane-based diamine therein. Next, using an automatic potentiometric titrator AT-610 manufactured by Kyoto Electronics Manufacturing Co., Ltd., a 0.1 N aqueous hydrochloric acid solution was added dropwise while stirring the solution, and an amount added dropwise at which the solution reaches a neutralization point was determined. An average molecular weight was calculated from the resulting amount of the 0.1 N aqueous hydrochloric acid solution added dropwise using the following formula (7).

$$2\times[10\times36.5\times(\text{amount added dropwise(g)})]/5 = \text{average molecular weight} \quad (7)$$

Next, a molecular weight of the polysiloxane-based diamine used was calculated from its chemical structural formula for the cases of n=1 and n=10, and thereby, a relationship between the value of n and the molecular weight was determined as a relational expression of a linear function. By applying the above average molecular weight to the relational expression, an average value of n was determined.

Names of abbreviations of acid dianhydrides, diamines, fillers and solvents which are respectively shown in the following production examples, are as follows.

ODPA: 3,3',4,4'-diphenyl ether tetracarboxylic dianhydride
PMDA: pyromellitic dianhydride
BSAA: 4,4'-[(isopropylidene)bis(p-phenyleneoxy)]diphthalic dianhydride
SiDA: 1,1,3,3-tetramethyl-1,3-bis(3-aminopropyl)disiloxane (molecular weight: 248, n=1 in the formula (1))
APPS1: α,ω-bis(3-aminopropyl)polydimethylsiloxane (average molecular weight: 400, n=3 in the formula (1))
APPS2: α,ω-bis(3-aminopropyl)polydimethylsiloxane (average molecular weight: 860, n=9 in the formula (1))
APPS3: α,ω-bis(3-aminopropyl)polydimethylsiloxane (average molecular weight: 1600, n=19 in the formula (1))
APPS4: α,ω-bis(3-aminopropyl)polydimethylsiloxane (average molecular weight: 3000, n=37 in the formula (1))
APPS5: α,ω-bis(3-aminopropyl)polydimethylsiloxane (average molecular weight: 4400, n=57 in the formula (1))
44DAE: 4,4'-diaminodiphenylether
APB: 1,3-bis(3-aminophenoxy)benzene
DABS: 4,4'-dihydroxy-3,3'-diaminophenyl sulfone
FDA: 9,9-bis(3-amino-4-hydroxyphenyl)fluorene
BAHF: 4,4'-dihydroxy-3,3'-diaminophenyl hexafluoropropane
MEK-ST-40: organic solvent-dispersed silica (solvent: MEK, silica: 40 wt %) (manufactured by NISSAN CHEMICAL INDUSTRIES, LTD.)
DMM: Dipropylene glycol dimethyl ether
DPMNP: Dipropylene glycol methyl-n-propyl ether
EDM: Diethylene glycol methyl ethyl ether
DPM: Dipropylene glycol methyl ether KBM-1003: Vinylsilane (manufactured by Shin-Etsu Chemical Co., Ltd.)

[Chemical Formula 26]

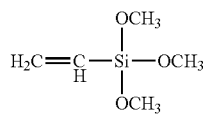

KBM-1003

Synthesis Example 1 (Polymerization of Polyamic Acid)

Into a reaction oven equipped with a thermometer, a dry nitrogen inlet port, a heating/cooling unit by warm water/cooling water and a stirring unit, 602.0 g (0.7 mol) of APPS2 and 60.1 g (0.3 mol) of 44DAE were charged together with 972.3 g of DMM, and the resulting mixture was dissolved. To this, 310.2 g (1 mol) of ODPA was added, and the resulting mixture was reacted at room temperature for 1 hour and subsequently at 60° C. for 5 hours to obtain a 50 wt % polyamic acid solution PA1 The glass transition temperature and 1% weight Loss temperature of the obtained polyamic acid were measured and summarized in Table 4.

Synthesis Examples 2 to 32 (Polymerization of Polyamic Acid)

50 wt % polyamic acid solutions (PA2 to PA32) were obtained by the same operation as in Production Example 1 except for changing types and charged amounts of the acid dianhydride and diamine as shown in Tables 1 to 4. The glass transition temperature and 1% weight Loss temperature of each of the obtained polyamic acids of PA26 to PA32 were measured and summarized in Table 4.

TABLE 1

Upper line: composition ratio (mol %)/lower line: charged amount (g)
Resin concentration; 50 wt %

| | | Acid Dianhydride | Diamine | | | | | | Solvent (g) |
| | | | (A1) | | | (B1) | | Aromatic | DMM |
| | | ODPA | APPS1 | APPS2 | APPS3 | APPS4 | APPS5 | 44DAE | (SP value; 7.8) |
|---|---|---|---|---|---|---|---|---|---|
| Synthesis Example 1 | PA1 | 100<br>310.2 | | 70<br>602.0 | | | | 30<br>60.1 | 972.3 |
| Synthesis Example 2 | PA2 | 100<br>310.2 | | 30<br>258 | | | 10<br>440.0 | 60<br>120.1 | 1128.3 |
| Synthesis Example 3 | PA3 | 100<br>310.2 | | 50<br>430.0 | | | 10<br>440.0 | 40<br>80.1 | 1260.3 |
| Synthesis Example 4 | PA4 | 100<br>155.1 | 70<br>280.0 | | | | 10<br>440 | 20<br>40.0 | 915.1 |
| Synthesis Example 5 | PA5 | 100<br>620.4 | | 70<br>602.0 | 10<br>160 | | | 20<br>40.0 | 1422.4 |
| Synthesis Example 6 | PA6 | 100<br>620.4 | | 70<br>602.0 | | 10<br>300.0 | | 20<br>40.0 | 1562.4 |
| Synthesis Example 7 | PA7 | 100<br>310.2 | | 70<br>602.0 | | | 10<br>440 | 20<br>40.0 | 1392.2 |
| Synthesis Example 8 | PA8 | 100<br>310.2 | | 70<br>602.0 | | | 0.01<br>0.44 | 29.99<br>60.04 | 972.7 |
| Synthesis Example 9 | PA9 | 100<br>310.2 | | 70<br>602.0 | | | 0.1<br>4.4 | 29.9<br>59.9 | 976.5 |
| Synthesis Example 10 | PA10 | 100<br>310.2 | | 70<br>602.0 | | | 1<br>44 | 29<br>58.1 | 1014.3 |
| Synthesis Example 11 | PA11 | 100<br>310.2 | | 60<br>516.0 | | | 30<br>1320 | 10<br>20.0 | 2166.2 |
| Synthesis Example 12 | PA12 | 100<br>310.2 | | 40<br>344.0 | | | 50<br>2200 | 10<br>20.0 | 2874.2 |

TABLE 2

Upper line: composition ratio (mol %)/lower line: charged amount (g)
Resin concentration; 50 wt %

| | | Acid Dianhydride | | | Diamine | | | | |
| | | | | | (A1) | (B1) | Aromatic | | |
| | | ODPA | PMDA | BSAA | APPS2 | APPS5 | 44DAE | APB | DABS |
|---|---|---|---|---|---|---|---|---|---|
| Synthesis Example 13 | PA13 | 100<br>310.2 | | | 30<br>344.0 | 70<br>3080 | | | |
| Synthesis Example 14 | PA14 | 100<br>310.2 | | | 70<br>602.0 | 10<br>440 | | 20<br>58.5 | |
| Synthesis Example 15 | PA15 | 100<br>310.2 | | | 70<br>602.0 | 10<br>440 | | | 20<br>49.7 |
| Synthesis Example 16 | PA16 | | 100<br>218.1 | | 70<br>602.0 | 10<br>440 | 20<br>40.0 | | |

TABLE 2-continued

Upper line: composition ratio (mol %)/lower line: charged amount (g)
Resin concentration; 50 wt %

| Synthesis Example | | | | | | |
|---|---|---|---|---|---|---|
| Synthesis Example 17 | PA17 | | 100 / 520.5 | 70 / 602.0 | 10 / 440 | 20 / 40.0 |
| Synthesis Example 18 | PA18 | 100 / 310.2 | | 70 / 602.0 | 10 / 440 | 20 / 40.0 |
| Synthesis Example 19 | PA19 | 100 / 310.2 | | 70 / 602.0 | 10 / 440 | 20 / 40.0 |
| Synthesis Example 20 | PA20 | 100 / 310.2 | | 70 / 602.0 | 10 / 440 | 20 / 40.0 |
| Synthesis Example 21 | PA21 | 100 / 310.2 | | 40 / 344.0 | 50 / 2200 | |
| Synthesis Example 22 | PA22 | 100 / 310.2 | | 40 / 344.0 | 50 / 2200 | |

| | | Diamine Aromatic | | Solvent (g) | | | |
|---|---|---|---|---|---|---|---|
| | | FDA | BAHF | DMM (SP value; 7.8) | DPMNP (SP value; 8.0) | EDM (SP value; 8.2) | DPM (SP value; 9.7) |
| Synthesis Example 13 | PA13 | | | 3734.2 | | | |
| Synthesis Example 14 | PA14 | | | 1410.7 | | | |
| Synthesis Example 15 | PA15 | | | 1401.9 | | | |
| Synthesis Example 16 | PA16 | | | 1300.1 | | | |
| Synthesis Example 17 | PA17 | | | 1602.5 | | | |
| Synthesis Example 18 | PA18 | | | | 1392.24 | | |
| Synthesis Example 19 | PA19 | | | | | 1392.24 | |
| Synthesis Example 20 | PA20 | | | | | | 1392.24 |
| Synthesis Example 21 | PA21 | 10 / 39.4 | | 2893.6 | | | |
| Synthesis Example 22 | PA22 | | 10 / 36.6 | 2890.8 | | | |

TABLE 3

Upper line: composition ratio (mol %)/lower line: charged amount (g)
resin concentration; 50 wt %

| | | Acid Dianhydride | Diamine | | | | Solvent (g) |
|---|---|---|---|---|---|---|---|
| | | | (A2) | (B2) | | Aromatic | |
| | | ODPA | APPS1 | APPS4 | APPS5 | 44DAE | DMM (SP value; 7.8) |
| Synthesis Example 23 | PA23 | 100 / 310.2 | 70 / 280 | | | 30 / 60.1 | 650.26 |
| Synthesis Example 24 | PA24 | 100 / 310.2 | | 70 / 2100.0 | | 30 / 60.1 | 2470.26 |
| Synthesis Example 25 | PA25 | 100 / 310.2 | | | 70 / 3080.0 | 30 / 60.1 | 3450.26 |

TABLE 4

Upper line: ratio (mol %)/lower line: content (g)
Resin concentration; 50 wt %

| | | Acid Dianhydride | Diamine | | | | | | | Solvent (g) | Tg | 1% Weight Loss Temperature |
|---|---|---|---|---|---|---|---|---|---|---|---|---|
| | | | Siloxane-based | | | Aromatic | | | | | | |
| | | ODPA | SiDA | APPS2 | APPS3 | 44DAE | APB | FDA | BAHF | DMM (SP value; 7.8) | (° C.) | (° C.) |
| Synthesis Example 1 | PA1 | 100 / 310.2 | | 70 / 602.0 | | 30 / 60.1 | | | | 972.3 | 30 | 367 |

TABLE 4-continued

Upper line: ratio (mol %)/lower line: content (g)
Resin concentration; 50 wt %

| | | Acid Dianhydride | Diamine | | | | | | | Solvent (g) | Tg | 1% Weight Loss |
| --- | --- | --- | --- | --- | --- | --- | --- | --- | --- | --- | --- | --- |
| | | | Siloxane-based | | | Aromatic | | | | DMM | | Temperature |
| | | ODPA | SiDA | APPS2 | APPS3 | 44DAE | APB | FDA | BAHF | (SP value; 7.8) | (° C.) | (° C.) |
| Synthesis Example 26 | PA26 | 100 310.2 | | | 70 1120.0 | 30 60.1 | | | | 1490.3 | 19 | 364.0 |
| Synthesis Example 27 | PA27 | 100 310.2 | | | 30 480.0 | 70 140.2 | | | | 930.4 | 130 | 411.0 |
| Synthesis Example 28 | PA28 | 100 310.2 | | | 40 640.0 | 60 120.2 | | | | 1070.4 | 88 | 402 |
| Synthesis Example 29 | PA29 | 100 310.2 | | 70 602.0 | | | 30 87.7 | | | 999.9 | 16 | 371 |
| Synthesis Example 30 | PA30 | 100 310.2 | 80 198.4 | | | | 20 40.0 | | | 548.6 | 112 | 392 |
| Synthesis Example 31 | PA31 | 100 310.2 | | 75 645.0 | | | 10 29.3 | 15 59.1 | | 1043.6 | 65 | 391 |
| Synthesis Example 32 | PA32 | 100 310.2 | | 75 645.0 | | | 10 29.3 | | 15 54.9 | 1039.4 | 40 | 371 |

Synthesis Example 33 (Synthesis of (b-1) Siloxane Compound)

Into a reaction oven equipped with a thermometer, a dry nitrogen inlet port, a heating/cooling unit by warm water/cooling water and a stirring unit, 1600.0 g (1.0 mol) of APPS3 was charged together with 1896.2 g of DMM, and the resulting mixture was dissolved. To this, 296.2 g (2.0 mol) of phthalic anhydride was added, and the resulting mixture was reacted at room temperature for 1 hour and subsequently at 60° C. for 5 hours to obtain a 50 wt % siloxane compound solution ((b-1)-1).

Synthesis Examples 34, 35 (Synthesis of (b-1) Siloxane Compound)

50 wt % siloxane compound solutions ((b-1)-2, (b-1)-3) were obtained by the same operation as in Production Example 1 except for changing types and charged amounts of the siloxane diamine and phthalic anhydride-based compound as shown in Table 5.

rimethoxysilane are mixed in a weight ratio of 6:4) was added. Subsequently, 10.21 g (0.1 mol) of an acetic anhydride was added dropwise slowly, and the resulting mixture was reacted at room temperature for 3 hours. A sediment was separated by filtration and dried, and the resulting synthesized product was referred to as AcAPMS. A structure of the AcAPMS is shown below.

[Chemical Formula 27]

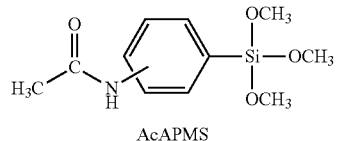

AcAPMS

Production Example 1 (Preparation of Adhesive Resin Composition)

Into a reaction oven equipped with a stirring unit, 99.99 g of the polyamic acid solution (PA1) obtained in Synthesis

TABLE 5

Upper line: ratio (mol %)/lower line: content (g)
Concentration: 50 wt %

| | | Siloxane Diamine | | Terminal | | Solvent |
| --- | --- | --- | --- | --- | --- | --- |
| | | APPS3 | APPS5 | Phthalic Anhydride | 4-tert-Butylphthalic Anhydride | DMM (SP value; 7.8) |
| Synthesis Example 33 | (b-1)-1 | 100 1600.0 | | 200 296.2 | | 1896.2 |
| Synthesis Example 34 | (b-1)-2 | | 100 4400 | | 200 408.4 | 4808.4 |
| Synthesis Example 35 | (b-1)-3 | | 100 4400.0 | 200 296.2 | | 4696.2 |

Synthesis Example 36

Into a 500 ml flask, 500 g of hexane was put, and to this, 21.33 g (0.1 mol) of aminophenyltrimethoxysilane (3-aminophenyltrimethoxysilane and 4-aminophenylt- Example 1 and 0.01 g of the polyamic acid solution (PA25) obtained in Synthesis Example 25 were charged, and the resulting mixture was stirred at room temperature for 2 hours to obtain an adhesive resin composition (PB1).

Production Examples 2 to 9 (Preparation of Adhesive Resin Composition)

Adhesive resin compositions (PB2 to PB9) were obtained by the same operation as in Production Example 1 except for changing types and charged amounts of the polyamic acid solution as shown in Table 6.

TABLE 6

|  |  | Polyamic Acid Solution (A2) | | Polyamic Acid Solution (B2) | |
|---|---|---|---|---|---|
|  | Type | n in General Formula (1) | Charged Amount (g) | Type | n in General Formula (1) | Charged Amount (g) |
| Production Example 1 | PB1 | PA1 | 9 | 99.99 | PA25 | 57 | 0.01 |
| Production Example 2 | PB2 | PA1 | 9 | 99.9 | PA25 | 57 | 0.1 |
| Production Example 3 | PB3 | PA1 | 9 | 99 | PA25 | 57 | 1 |
| Production Example 4 | PB4 | PA1 | 9 | 90 | PA25 | 57 | 10 |
| Production Example 5 | PB5 | PA1 | 9 | 70 | PA25 | 57 | 30 |
| Production Example 6 | PB6 | PA1 | 9 | 50 | PA25 | 57 | 50 |
| Production Example 7 | PB7 | PA1 | 9 | 30 | PA25 | 57 | 70 |
| Production Example 8 | PB8 | PA1 | 9 | 90 | PA24 | 37 | 10 |
| Production Example 9 | PB9 | PA23 | 3 | 90 | PA25 | 57 | 10 |

Production Example 10 (Preparation of Adhesive Resin Composition)

Into a reaction oven equipped with a stirring unit, 100 g of the polyamic acid solution (PA12) obtained in Synthesis Example 12 and 1.25 g of MEK-ST-40 as a filler solution were charged, and the resulting mixture was stirred at room temperature for 2 hours to obtain an adhesive resin composition (AH1).

Production Examples 11 to 14 (Preparation of Adhesive Resin Composition)

Adhesive resin compositions (AH2 to AH5) were obtained by the same operation as in Production Example 10 except for changing types and charged amounts of the polyamic acid solution as shown in Table 7.

Production Example 15 (Preparation of Adhesive Resin Composition)

Into a reaction oven equipped with a stirring unit, 200.0 g of the polyamic acid solution (PA1) obtained in Synthesis Example 1, 10.0 g of a 50 wt % APPS5 solution (solvent: DMM), 5.0 g of AcAPMS obtained in Synthesis Example 33, and 12.0 g of MEK-ST-40 as a filler solution were charged, and the resulting mixture was stirred at room temperature for 2 hours to obtain an adhesive resin composition (AH6).

Production Examples 16 to 45 (Preparation of Adhesive Resin Composition)

Adhesive resin compositions (AH7 to AH36) were obtained by the same operation as in Production Example 15 except for changing charged amounts of the (a) resin, the (b-1) compound of the general formula (2), the (b-2) compound of the general formula (3) and the MEK-ST-40 as shown in Table 8.

TABLE 7

|  |  | Polyamic Acid Solution | | Filler | | |
|---|---|---|---|---|---|---|
|  |  | Type | Charged Amount (g) | Type | Charged Amount (g) | Weight Ratio to Resin |
| Production Example 10 | AH1 | PA12 | 100 | MEK-ST-40 | 1.25 | 1% |
| Production Example 11 | AH2 | PA12 | 100 | MEK-ST-40 | 6.25 | 5% |
| Production Example 12 | AH3 | PA12 | 100 | MEK-ST-40 | 12.5 | 10% |
| Production Example 13 | AH4 | PA21 | 100 | MEK-ST-40 | 18.8 | 15% |
| Production Example 14 | AH5 | PA22 | 100 | MEK-ST-40 | 18.8 | 15% |

TABLE 8

| | | (a) Resin concentration: 50 wt % | | (b-1) Compound of General Formula (1) Concentration: 50 wt % | | (b-2) Compound of General Formula (2) | | Inorganic Particle concentration: 40 wt % | |
|---|---|---|---|---|---|---|---|---|---|
| | | Type | Charged Amount (g) | Type | Charged Amount (g) | Type | Charged Amount (g) | Type | Charged Amount (g) |
| Production Example 15 | AH6 | PA1 | 200.0 | APPS5 | 10.0 | AcAPMS | 5.0 | MEK-ST-40 | 12.0 |
| Production Example 16 | AH7 | PA24 | 200.0 | APPS5 | 10.0 | AcAPMS | 5.0 | MEK-ST-40 | 12.0 |
| Production Example 17 | AH8 | PA25 | 200.0 | APPS5 | 10.0 | AcAPMS | 5.0 | MEK-ST-40 | 12.0 |
| Production Example 18 | AH9 | PA26 | 200.0 | APPS5 | 10.0 | AcAPMS | 5.0 | MEK-ST-40 | 12.0 |
| Production Example 19 | AH10 | PA27 | 200.0 | APPS5 | 10.0 | AcAPMS | 5.0 | MEK-ST-40 | 12.0 |
| Production Example 20 | AH11 | PA28 | 200.0 | APPS5 | 10.0 | AcAPMS | 5.0 | MEK-ST-40 | 12.0 |
| Production Example 21 | AH12 | PA1 | 200.0 | (b-1)-1 | 10.0 | AcAPMS | 5.0 | MEK-ST-40 | 12.0 |
| Production Example 22 | AH13 | PA1 | 200.0 | (b-1)-2 | 10.0 | AcAPMS | 5.0 | MEK-ST-40 | 12.0 |
| Production Example 23 | AH14 | PA1 | 200.0 | (b-1)-3 | 10.0 | AcAPMS | 5.0 | MEK-ST-40 | 12.0 |
| Production Example 24 | AH15 | PA1 | 200.0 | APPS3 | 10.0 | AcAPMS | 5.0 | MEK-ST-40 | 12.0 |
| Production Example 25 | AH16 | PA1 | 200.0 | APPS5 | 0.02 | AcAPMS | 5.0 | MEK-ST-40 | 12.0 |
| Production Example 26 | AH17 | PA1 | 200.0 | APPS5 | 0.2 | AcAPMS | 5.0 | MEK-ST-40 | 12.0 |
| Production Example 27 | AH18 | PA1 | 200.0 | APPS5 | 2.0 | AcAPMS | 5.0 | MEK-ST-40 | 12.0 |
| Production Example 28 | AH19 | PA1 | 200.0 | APPS5 | 20.0 | AcAPMS | 5.0 | MEK-ST-40 | 12.0 |
| Production Example 29 | AH20 | PA1 | 200.0 | APPS5 | 40.0 | AcAPMS | 5.0 | MEK-ST-40 | 12.0 |
| Production Example 30 | AH21 | PA1 | 200.0 | APPS5 | 60.0 | AcAPMS | 5.0 | MEK-ST-40 | 12.0 |
| Production Example 31 | AH22 | PA1 | 200.0 | APPS5 | 10.0 | AcAPMS | 0.01 | MEK-ST-40 | 12.0 |
| Production Example 32 | AH23 | PA1 | 200.0 | APPS5 | 10.0 | AcAPMS | 0.1 | MEK-ST-40 | 12.0 |
| Production Example 33 | AH24 | PA1 | 200.0 | APPS5 | 10.0 | AcAPMS | 1.0 | MEK-ST-40 | 12.0 |
| Production Example 34 | AH25 | PA1 | 200.0 | APPS5 | 10.0 | AcAPMS | 10.0 | MEK-ST-40 | 12.0 |
| Production Example 35 | AH26 | PA1 | 200.0 | APPS5 | 10.0 | AcAPMS | 20.0 | MEK-ST-40 | 12.0 |
| Production Example 36 | AH27 | PA1 | 200.0 | APPS5 | 10.0 | AcAPMS | 30.0 | MEK-ST-40 | 12.0 |
| Production Example 37 | AH28 | PA1 | 200.0 | APPS5 | 10.0 | | | MEK-ST-40 | 12.0 |
| Production Example 38 | AH29 | PA1 | 200.0 | (b-1)-3 | 10.0 | | | MEK-ST-40 | 12.0 |
| Production Example 39 | AH30 | PA1 | 200.0 | | | AcAPMS | 5.0 | MEK-ST-40 | 12.0 |
| Production Example 40 | AH31 | PA1 | 200.0 | | | | | MEK-ST-40 | 12.0 |
| Production Example 41 | AH32 | PA1 | 200.0 | APPS2 | 10.0 | | | MEK-ST-40 | 12.0 |
| Production Example 42 | AH33 | PA1 | 200.0 | | | KBM-1003 | 10.0 | MEK-ST-40 | 12.0 |
| Production Example 43 | AH34 | PA29 | 200.0 | APPS5 | 10.0 | AcAPMS | 5.0 | MEK-ST-40 | 12.0 |
| Production Example 44 | AH35 | PA30 | 200.0 | APPS5 | 10.0 | AcAPMS | 5.0 | MEK-ST-40 | 75.0 |
| Production Example 45 | AH36 | PA29 | 200.0 | APPS5 | 10.0 | AcAPMS | 5.0 | MEK-ST-40 | 75.0 |

Production Example 46 (Preparation of Rework Solvent)

Into a reaction oven equipped with a stirring unit, 30 g of monoethanolamine, 30 g of DMM, and 30 g of N-methyl-2-pyrrolidone were charged, and the resulting mixture was stirred at room temperature for 1 hour to obtain a rework solvent.

Example 1

The polyamic acid solution (PA3) obtained in Synthesis Example 3 was applied onto a 8-inch silicon substrate of 750 mm in thickness (manufactured by Shin-Etsu Chemical Co., Ltd.) with a spin coater the number of revolutions of which was adjusted so that the applied polyamic acid solution has a thickness of 20 μm after drying and imidization, and the polyamic acid solution was heat-treated at 120° C. for 10 minutes to be dried, and heat-treated at 350° C. for 1 hour to be completely imidized, and thereby an adhesive layer-laminated silicon substrate was obtained.

On the adhesive layer-laminated silicon substrate prepared in the above way, a 8-inch alkali-free glass substrate of 0.7 mm in thickness (manufactured by Corning Incorporated) was overlaid, and was press-bonded for 5 minutes at a load of 2000 N using a hot press machine whose upper plate and lower plate were set at 180° C. to obtain a glass substrate-laminated silicon substrate. Using the obtained glass substrate-laminated silicon substrate, evaluations of adhesiveness, heat resistance, backgrinding of a silicon substrate, de-bonding and rework were performed, and results thereof are summarized in Table 9. Further, the storage stability of the polyamic acid resin composition was evaluated, and the result thereof is summarized in Table 9.

Examples 2 to 25

Glass substrate-laminated silicon substrates were obtained by the same operation as in Example 1 except for changing the polyamic acid resin composition to compositions shown in Table 9 and Table 10.

Using each of the obtained glass substrate-laminated silicon substrates, evaluations of adhesiveness, heat resistance, backgrinding of a silicon substrate, de-bonding and rework were performed, and results thereof are summarized in Table 9 and Table 10. Further, the storage stability of each of the polyamic acid resin compositions was evaluated, and the result thereof is summarized in Table 9 and Table 10.

Comparative Examples 1 to 3

Glass substrate-laminated silicon substrates were obtained by the same operation as in Example 1 except for changing the polyamic acid resin composition to compositions shown in Table 8 and Table 9.

Using each of the obtained glass substrate-laminated silicon substrates, evaluations of adhesiveness, heat resistance, backgrinding of a silicon substrate, de-bonding and rework were performed, and results thereof are summarized in Table 9 and Table 10. Further, the storage stability of each of the polyamic acid resin compositions was evaluated, and the result thereof is summarized in Table 9 and Table 10.

TABLE 9

| | Temporary-Bonding Adhesive | (a1) n in General Formula (1) | (a1) Content (mol %) | (b1) n in General Formula (1) | (b1) Content (mol %) | Solvent | Storage Stability |
|---|---|---|---|---|---|---|---|
| Example 1 | PA3 | 9 | 50 | 57 | 10 | DMM | S |
| Example 2 | PA4 | 3 | 70 | 57 | 10 | DMM | S |
| Example 3 | PA5 | 9 | 70 | 19 | 10 | DMM | S |
| Example 4 | PA6 | 9 | 70 | 37 | 10 | DMM | S |
| Example 5 | PA7 | 9 | 70 | 57 | 10 | DMM | S |
| Example 6 | PA8 | 9 | 70 | 57 | 0.01 | DMM | S |
| Example 7 | PA9 | 9 | 70 | 57 | 0.1 | DMM | S |
| Example 8 | PA10 | 9 | 70 | 57 | 1 | DMM | S |
| Example 9 | PA11 | 9 | 60 | 57 | 30 | DMM | S |
| Example 10 | PA12 | 9 | 40 | 57 | 50 | DMM | S |
| Example 11 | PA14 | 9 | 70 | 57 | 10 | DMM | S |
| Example 12 | PA15 | 9 | 70 | 57 | 10 | DMM | S |
| Example 13 | PA16 | 9 | 70 | 57 | 10 | DMM | S |
| Example 14 | PA17 | 9 | 70 | 57 | 10 | DMM | S |
| Example 15 | PA18 | 9 | 70 | 57 | 10 | DPNMP | S |
| Example 16 | PA19 | 9 | 70 | 57 | 10 | EDM | A |
| Example 17 | PA20 | 9 | 70 | 57 | 10 | DPM | B |
| Comparative Example 1 | PA2 | 9 | 30 | 57 | 10 | DMM | S |
| Comparative Example 2 | PA13 | 9 | 30 | 57 | 70 | DMM | S |

| | Adhesiveness Evaluation | | Heat Resistances Evaluation | | De-bonding Evaluation | Rework Evaluation |
|---|---|---|---|---|---|---|
| | Adhesiveness | Void Evaluation | Void Evaluation | Fractures after Backgrinding | | |
| Example 1 | A | A | A | none | A | A |
| Example 2 | A | A | A | none | A | A |
| Example 3 | A | A | A | none | A | A |
| Example 4 | A | A | A | none | A | A |
| Example 5 | A | A | A | none | A | A |
| Example 6 | A | A | A | none | A | A |
| Example 7 | A | A | A | none | A | A |
| Example 8 | A | A | A | none | A | A |
| Example 9 | A | A | A | none | A | A |
| Example 10 | A | A | B | none | A | A |
| Example 11 | A | A | A | none | A | A |
| Example 12 | A | A | A | none | A | A |
| Example 13 | A | A | A | none | A | A |
| Example 14 | A | A | A | none | A | A |
| Example 15 | A | A | A | none | A | A |

TABLE 9-continued

| | | | | | | |
|---|---|---|---|---|---|---|
| Example 16 | A | A | A | none | A | A |
| Example 17 | A | A | A | none | A | A |
| Comparative Example 1 | C | not performed because of defective adhesiveness | | | | |
| Comparative Example 2 | A | A | C | present | B | A |

TABLE 10

| | Temporary-Bonding Adhesive | (a1) n in General Formula (1) | (a1) Content (mol %) | (b1) n in General Formula (1) | (b1) Content (mol %) | Solvent | Storage Stability |
|---|---|---|---|---|---|---|---|
| Example 18 | PB1 | 9 | 99.99 | 57 | 0.01 | DMM | S |
| Example 19 | PB2 | 9 | 99.9 | 57 | 0.1 | DMM | S |
| Example 20 | PB3 | 9 | 99 | 57 | 1 | DMM | S |
| Example 21 | PB4 | 9 | 90 | 57 | 10 | DMM | S |
| Example 22 | PB5 | 9 | 70 | 57 | 30 | DMM | S |
| Example 23 | PB6 | 9 | 50 | 57 | 50 | DMM | S |
| Example 24 | PB8 | 9 | 90 | 37 | 10 | DMM | S |
| Example 25 | PB9 | 3 | 90 | 57 | 10 | DMM | S |
| Comparative Example 3 | PB7 | 9 | 30 | 57 | 70 | DMM | S |

| | Adhesiveness Evaluation | | Heat Resistances Evaluation | | | |
|---|---|---|---|---|---|---|
| | Adhesiveness | Void Evaluation | Void Evaluation | Fractures after Backgrinding | De-bonding Evaluation | Rework Evaluation |
| Example 18 | A | A | A | none | A | A |
| Example 19 | A | A | A | none | A | A |
| Example 20 | A | A | A | none | A | A |
| Example 21 | A | A | A | none | A | A |
| Example 22 | A | A | A | none | A | A |
| Example 23 | A | A | B | none | A | A |
| Example 24 | A | A | A | none | A | A |
| Example 25 | A | A | A | none | A | A |
| Comparative Example 3 | A | A | C | present | B | A |

Examples 26 to 58

Glass substrate-laminated silicon substrates were obtained by the same operation as in Example 1 except for changing the polyamic acid resin composition to compositions shown in Table 11 to Table 13.

Using each of the obtained glass substrate-laminated silicon substrates, evaluations of adhesiveness, heat resistance, backgrinding of a silicon substrate, de-bonding and rework were performed, and results thereof are summarized in Table 11 to Table 13. Further, the storage stability of each of the polyamic acid resin compositions was evaluated and the sedimentation evaluation of inorganic particles was performed, and the results thereof are summarized in Table 11 to Table 13.

Comparative Examples 4 to 6

Glass substrate-laminated silicon substrates were obtained by the same operation as in Example 1 except for changing the polyamic acid resin composition to compositions shown in Table 11 to Table 13.

Using each of the obtained glass substrate-laminated silicon substrates, evaluations of adhesiveness, heat resistance, backgrinding of a silicon substrate, de-bonding and rework were performed, and results thereof are summarized in Table 11 to Table 13. Further, the storage stability of each of the polyamic acid resin compositions was evaluated and the sedimentation evaluation of inorganic particles was performed, and the results thereof are summarized in Table 11 to Table 13.

TABLE 11

| | Temporary-Bonding Adhesive | (a1) n in General Formula (1) | (a1) Content (mol %) | (b1) n in General Formula (1) | (b1) Content (mol %) | Weight Ratio to Inorganic Particle Resin | Storage Stability | Adhesiveness Evaluation Adhesiveness | Adhesiveness Evaluation Void Evaluation |
|---|---|---|---|---|---|---|---|---|---|
| Example 26 | AH1 | 9 | 40 | 57 | 50 | 1% | S | A | A |
| Example 27 | AH2 | 9 | 40 | 57 | 50 | 5% | S | A | A |
| Example 28 | AH3 | 9 | 40 | 57 | 50 | 10% | S | A | A |
| Example 29 | AH4 | 9 | 40 | 57 | 50 | 15% | S | A | A |
| Example 30 | AH5 | 9 | 40 | 57 | 50 | 15% | S | A | A |

TABLE 11-continued

|  | Heat Resistances Evaluation Void Evaluation | Fractures after Backgrinding | De-bonding Evaluation | Rework Evaluation | Sedimentation Evaluation of Inorganic Particles |
|---|---|---|---|---|---|
| Example 26 | A | none | A | A | A |
| Example 27 | A | none | A | A | A |
| Example 28 | A | none | A | A | A |
| Example 29 | A | none | A | A | S |
| Example 30 | A | none | A | A | S |

TABLE 12

| | | (a) Resin | | | (b-1) | |
|---|---|---|---|---|---|---|
| Temporary-Bonding Adhesive | Type | Tg (° C.) | 1% Weight Loss Temperature (° C.) | Type | n in General Formula (1) | Addition Ratio to (a) Resin (wt %) |
| Example 31 | AH6 | PA1 | 30 | 367 | APPS5 | 57 | 5 |
| Example 32 | AH7 | PA26 | 19 | 364 | APPS5 | 57 | 5 |
| Example 33 | AH8 | PA27 | 130 | 411 | APPS5 | 57 | 5 |
| Example 34 | AH9 | PA28 | 88 | 402 | APPS5 | 57 | 5 |
| Example 35 | AH10 | PA29 | 16 | 371 | APPS5 | 57 | 5 |
| Example 36 | AH11 | PA30 | 112 | 392 | APPS5 | 57 | 5 |
| Example 37 | AH12 | PA1 | 30 | 367 | (b-1)-1 | 19 | 5 |
| Example 38 | AH13 | PA1 | 30 | 367 | (b-1)-2 | 57 | 5 |
| Example 39 | AH14 | PA1 | 30 | 367 | (b-1)-3 | 57 | 5 |
| Example 40 | AH15 | PA1 | 30 | 367 | APPS3 | 57 | 5 |
| Example 41 | AH16 | PA1 | 30 | 367 | APPS5 | 57 | 0.01 |
| Example 42 | AH17 | PA1 | 30 | 367 | APPS5 | 57 | 0.1 |
| Example 43 | AH18 | PA1 | 30 | 367 | APPS5 | 57 | 1 |
| Example 44 | AH19 | PA1 | 30 | 367 | APPS5 | 57 | 10 |
| Example 45 | AH20 | PA1 | 30 | 367 | APPS5 | 57 | 20 |
| Example 46 | AH21 | PA1 | 30 | 367 | APPS5 | 57 | 30 |
| Example 47 | AH22 | PA1 | 30 | 367 | APPS5 | 57 | 5 |
| Example 48 | AH23 | PA1 | 30 | 367 | APPS5 | 57 | 5 |
| Example 49 | AH24 | PA1 | 30 | 367 | APPS5 | 57 | 5 |
| Example 50 | AH25 | PA1 | 30 | 367 | APPS5 | 57 | 5 |
| Example 51 | AH26 | PA1 | 30 | 367 | APPS5 | 57 | 5 |
| Example 52 | AH27 | PA1 | 30 | 367 | APPS5 | 57 | 5 |
| Example 53 | AH28 | PA1 | 30 | 367 | APPS5 | 57 | 5 |
| Example 54 | AH29 | PA1 | 30 | 367 | (b-1)-3 | 57 | 5 |
| Example 55 | AH30 | PA1 | 30 | 367 | without addition | | |
| Example 56 | AH34 | PA31 | 65 | 391 | APPS5 | 57 | 5 |
| Example 57 | AH35 | PA32 | 40 | 371 | APPS5 | 57 | 5 |
| Example 58 | AH36 | PA31 | 65 | 391 | APPS5 | 57 | 5 |
| Comparative Example 4 | AH31 | PA1 | 30 | 367 | without addition | | |
| Comparative Example 5 | AH32 | PA1 | 30 | 367 | APPS2 | 9 | 5.0 |
| Comparative Example 6 | AH33 | PA1 | 30 | 367 | without addition | | |

| | | (b-2) | | |
|---|---|---|---|---|
| | Type | Addition Ratio to (a) Resin (wt %) | Weight Ratio to Inorganic Particle Resin | Solvent |
| Example 31 | AcAPMS | 5 | 4.80% | DMM |
| Example 32 | AcAPMS | 5 | 4.80% | DMM |
| Example 33 | AcAPMS | 5 | 4.80% | DMM |
| Example 34 | AcAPMS | 5 | 4.80% | DMM |
| Example 35 | AcAPMS | 5 | 4.80% | DMM |
| Example 36 | AcAPMS | 5 | 4.80% | DMM |
| Example 37 | AcAPMS | 5 | 4.80% | DMM |
| Example 38 | AcAPMS | 5 | 4.80% | DMM |
| Example 39 | AcAPMS | 5 | 4.80% | DMM |
| Example 40 | AcAPMS | 5 | 4.80% | DMM |
| Example 41 | AcAPMS | 5 | 4.80% | DMM |
| Example 42 | AcAPMS | 5 | 4.80% | DMM |
| Example 43 | AcAPMS | 5 | 4.80% | DMM |
| Example 44 | AcAPMS | 5 | 4.80% | DMM |
| Example 45 | AcAPMS | 5 | 4.80% | DMM |
| Example 46 | AcAPMS | 5 | 4.80% | DMM |

TABLE 12-continued

|  | | | | |
|---|---|---|---|---|
| Example 47 | AcAPMS | 0.01 | 4.80% | DMM |
| Example 48 | AcAPMS | 0.1 | 4.80% | DMM |
| Example 49 | AcAPMS | 1 | 4.80% | DMM |
| Example 50 | AcAPMS | 10 | 4.80% | DMM |
| Example 51 | AcAPMS | 20 | 4.80% | DMM |
| Example 52 | AcAPMS | 30 | 4.80% | DMM |
| Example 53 | without addition | | 4.80% | DMM |
| Example 54 | without addition | | 4.80% | DMM |
| Example 55 | AcAPMS | 5 | 4.80% | DMM |
| Example 56 | AcAPMS | 5 | 4.80% | DMM |
| Example 57 | AcAPMS | 5 | 15.00% | DMM |
| Example 58 | AcAPMS | 5 | 15.00% | DMM |
| Comparative Example 4 | without addition | | 4.80% | DMM |
| Comparative Example 5 | without addition | | 4.80% | DMM |
| Comparative Example 6 | KBM-1003 | 5.0 | 4.80% | DMM |

TABLE 13

| | Temporary-Bonding Adhesive | Storage Stability | Adhesiveness Evaluation | | Heat Resistances Evaluation | | De-bonding Evaluation | Rework Evaluation | Sedimentation Evaluation of Inorganic Particles |
|---|---|---|---|---|---|---|---|---|---|
| | | | Adhesiveness | Void Evaluation | Void Evaluation | Fractures after Backgrinding | | | |
| Example 31 | AH6 | S | A | A | A | none | A | A | A |
| Example 32 | AH7 | S | A | A | A | none | A | A | A |
| Example 33 | AH8 | S | A | B | A | none | A | A | A |
| Example 34 | AH9 | S | A | A | A | none | A | A | A |
| Example 35 | AH10 | S | A | A | A | none | A | A | A |
| Example 36 | AH11 | S | A | B | A | none | A | A | A |
| Example 37 | AH12 | S | A | A | A | none | A | A | A |
| Example 38 | AH13 | S | A | A | A | none | A | A | A |
| Example 39 | AH14 | S | A | A | A | none | A | A | A |
| Example 40 | AH15 | S | A | A | A | none | A | A | A |
| Example 41 | AH16 | S | A | A | A | none | A | A | A |
| Example 42 | AH17 | S | A | A | A | none | A | A | A |
| Example 43 | AH18 | S | A | A | A | none | A | A | A |
| Example 44 | AH19 | S | A | A | A | none | A | A | A |
| Example 45 | AH20 | S | A | B | A | none | A | A | A |
| Example 46 | AH21 | S | A | B | A | none | A | A | A |
| Example 47 | AH22 | S | A | A | A | none | A | A | A |
| Example 48 | AH23 | S | A | A | A | none | A | A | A |
| Example 49 | AH24 | S | A | A | A | none | A | A | A |
| Example 50 | AH25 | S | A | A | A | none | A | A | A |
| Example 51 | AH26 | S | A | A | B | none | A | A | A |
| Example 52 | AH27 | S | A | A | B | none | A | A | A |
| Example 53 | AH28 | S | A | A | B | none | A | A | A |
| Example 54 | AH29 | S | A | A | A | none | A | A | A |
| Example 55 | AH30 | S | A | A | A | none | B2 | A | A |
| Example 56 | AH34 | S | A | A | A | none | A | A | S |
| Example 57 | AH35 | S | A | A | A | none | A | A | S |
| Example 58 | AH36 | S | A | A | A | none | A | A | S |
| Comparative Example 4 | AH31 | S | A | A | C | present | B2 | A | A |
| Comparative Example 5 | AH32 | S | A | A | C | present | B2 | A | A |
| Comparative Example 6 | AH33 | S | A | A | C | present | B2 | A | A |

The invention claimed is:

1. A temporary-bonding adhesive, wherein the temporary-bonding adhesive is a polyimide copolymer having at least an acid dianhydride residue and a diamine residue, the diamine residue includes both of (A1) a polysiloxane-based diamine residue represented by a general formula (1) in which n is a natural number of 1 to 15, and (B1) a polysiloxane-based diamine residue represented by a general formula (1) in which n is a natural number of 16 to 100, and the polyimide copolymer contains 40 to 99.99 mol % of the (A1) residue and 0.01 to 60 mol % of the (B1) residue:

[Chemical Formula 1]

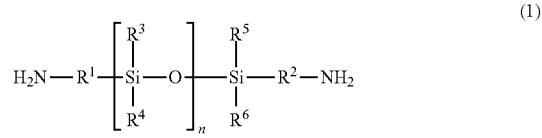

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

2. The temporary-bonding adhesive according to claim 1, further comprising (c) a solvent.

3. The temporary-bonding adhesive according to claim 2, wherein the (c) solvent contains a solvent having an SP value of 7.5 to 9.0.

4. The temporary-bonding adhesive according to claim 2, wherein the (c) solvent contains a solvent represented by a general formula (6):

[Chemical Formula 5]

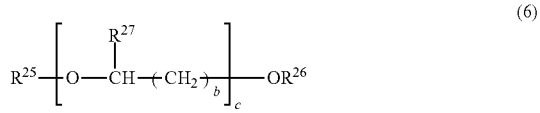

(6)

in which $R^{25}$ and $R^{26}$ independently represent hydrogen, alkyl groups having 1 to 12 carbon atoms, an acetyl group, or aromatic groups, $R^{27}$ represents hydrogen or a methyl group, b is either 0, 1 or 2, and c is an integer of 1 to 3.

5. The temporary-bonding adhesive according to claim 1, further comprising inorganic particles.

6. An adhesive layer obtained by forming a coating of the temporary-bonding adhesive according to anyone of claim 1.

7. A wafer work piece formed by bonding a semiconductor circuit formation substrate to a support substrate with at least the adhesive layer according to claim 6 interposed therebetween.

8. A method for manufacturing a semiconductor device using the wafer work piece according to claim 7 comprising at least any one of a step of fabricating the semiconductor circuit formation substrate into a thinner one, a step of subjecting the semiconductor circuit formation substrate of the wafer work piece to device processing, a step of de-bonding off the semiconductor circuit formation substrate of the wafer work piece from a support substrate, and a step of washing, with a solvent, an adhesive layer adhering to the semiconductor circuit formation substrate de-bonded off from the wafer work piece or the support substrate of the wafer work piece.

9. A method for manufacturing a semiconductor device, wherein the step of fabricating the semiconductor circuit formation substrate into a thinner one according to claim 8 comprises a step of fabricating a thickness of the semiconductor circuit formation substrate to at least 1 μm and at most 100 μm.

10. A wafer work piece formed by bonding a semiconductor circuit formation substrate to a support substrate with the adhesive layer according to claim 6 interposed therebetween.

11. A polyimide copolymer having at least an acid dianhydride residue and a diamine residue, wherein the diamine residue includes both of (A1) a polysiloxane-based diamine residue represented by a general formula (1) in which n is a natural number of 1 to 15, and (B1) a polysiloxane-based diamine residue represented by a general formula (1) in which n is a natural number of 16 to 100, and the polyimide copolymer contains 40 to 99.99 mol % of the (A1) residue and 0.01 to 60 mol % of the (B1) residue:

[Chemical Formula 7]

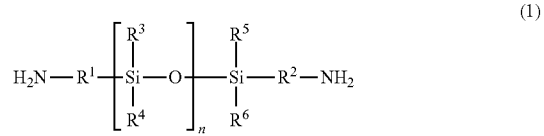

(1)

in which n is a natural number, $R^1$ and $R^2$ may be the same or different and represent an alkylene group having 1 to 30 carbon atoms or a phenylene group, and $R^3$ to $R^6$ may be the same or different and represent an alkyl group having 1 to 30 carbon atoms, a phenyl group, or a phenoxy group.

* * * * *